(12) United States Patent
Furutani et al.

(10) Patent No.: US 12,179,223 B2
(45) Date of Patent: Dec. 31, 2024

(54) RECTIFYING PLATE, FLUID-INTRODUCING APPARATUS, AND FILM-FORMING APPARATUS

(71) Applicants: KABUSHIKI KAISHA TOSHIBA, Tokyo (JP); NuFlare Technology, Inc., Yokohama (JP)

(72) Inventors: Yuki Furutani, Hiratsuka (JP); Yoshiaki Daigo, Yokohama (JP); Takuto Umetsu, Yokohama (JP); Shun Haruyama, Yokohama (JP); Keiko Shiozawa, Fujisawa (JP)

(73) Assignees: KABUSHIKI KAISHA TOSHIBA, Tokyo (JP); NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/513,057

(22) Filed: Oct. 28, 2021

(65) Prior Publication Data

US 2022/0134359 A1 May 5, 2022

(30) Foreign Application Priority Data

Oct. 30, 2020 (JP) .................................. 2020-182540
Oct. 27, 2021 (JP) .................................. 2021-175156

(51) Int. Cl.
*B05B 1/14* (2006.01)
*B05B 1/00* (2006.01)

(52) U.S. Cl.
CPC .............. *B05B 1/14* (2013.01); *B05B 1/005* (2013.01)

(58) Field of Classification Search
None
See application file for complete search history.

(56) References Cited

U.S. PATENT DOCUMENTS 6,402,847 B1 * 6/2002 Takagi .............. H01L 21/67017
118/723 R
6,599,367 B1 * 7/2003 Nakatsuka ........ C23C 16/45565
118/728

(Continued)

FOREIGN PATENT DOCUMENTS

CN 103215567 A 7/2013
CN 216585315 U 5/2022

(Continued)

OTHER PUBLICATIONS

A. Veneroni et al., "Gas-Phase and Surface Kinetics of Epitaxial Silicon Carbide Growth Involving Chlorine-Containing Species", Chemical Vapor Deposition vol. 12, 7 pages (2006).

(Continued)

*Primary Examiner* — Jethro M. Pence
(74) *Attorney, Agent, or Firm* — Oblon, McClelland, Maier & Neustadt, L.L.P.

(57) ABSTRACT

According to one embodiment, a rectifying plate is opposed to a plurality of nozzles which are configured to inject a fluid. The rectifying plate is configured to rectify the fluid. The rectifying plate includes: a plurality of high flow path resistance areas, and a low flow path resistance area. Each of the high flow path resistance areas includes a nozzle-facing area which is opposed to one of the plurality of nozzles. The low flow path resistance area surrounds each of the plurality of high flow path resistance areas. The low flow path resistance area includes a plurality of first through-holes to allow the fluid to pass through and having a smaller flow path resistance of the fluid than that of the high flow path resistance area.

8 Claims, 14 Drawing Sheets

(56) References Cited

U.S. PATENT DOCUMENTS

| | | | |
|---|---|---|---|
| 8,460,470 B2* | 6/2013 | Hirata | C30B 25/10 |
| | | | 118/725 |
| 9,518,322 B2* | 12/2016 | Ito | C30B 25/14 |
| 10,607,817 B2* | 3/2020 | Franklin | B05B 1/005 |
| 10,837,113 B2* | 11/2020 | Tsuno | H01J 37/3266 |
| 10,920,317 B2* | 2/2021 | Yamada | C23C 16/45565 |
| 11,508,558 B2* | 11/2022 | Franklin | H01J 37/32981 |
| 2003/0019580 A1 | 1/2003 | Strang | |
| 2005/0223986 A1* | 10/2005 | Choi | C23C 16/45559 |
| | | | 427/248.1 |
| 2010/0193471 A1* | 8/2010 | Funk | H01J 37/32834 |
| | | | 427/569 |
| 2013/0152853 A1* | 6/2013 | Suzuki | C30B 25/165 |
| | | | 118/724 |
| 2014/0127116 A1* | 5/2014 | Filtvedt | B01J 8/44 |
| | | | 239/548 |
| 2014/0230730 A1* | 8/2014 | Choi | C23C 16/45559 |
| | | | 239/548 |
| 2015/0013793 A1* | 1/2015 | Chuc | C23C 16/45565 |
| | | | 137/561 A |
| 2016/0340782 A1 | 11/2016 | Chandrasekharan et al. | |
| 2017/0283985 A1* | 10/2017 | Takahashi | C30B 29/406 |
| 2022/0134362 A1* | 5/2022 | Chen | B05B 1/005 |
| | | | 156/345.33 |
| 2023/0044440 A1* | 2/2023 | Daigo | H01L 21/68785 |
| 2023/0088313 A1* | 3/2023 | Terhorst | B05B 1/14 |
| | | | 239/290 |

FOREIGN PATENT DOCUMENTS

| | | |
|---|---|---|
| EP | 1 061 155 A1 | 12/2000 |
| JP | 11-256328 | 9/1999 |
| JP | 2001-308016 | 11/2001 |
| JP | 2001-314781 | 11/2001 |
| JP | 2008-91805 | 4/2008 |
| JP | 2010-538498 | 12/2010 |
| JP | 4819411 B2 | 11/2011 |
| JP | 2012-126968 A | 7/2012 |
| JP | 2013-149513 A | 8/2013 |
| JP | 2018-148143 | 9/2018 |
| JP | 2019-192865 | 10/2019 |
| KR | 2001-0041619 A | 5/2001 |

OTHER PUBLICATIONS

Office Action mailed Oct. 1, 2024 in Japanese Application No. 2021-175156 filed Oct. 27, 2021, (w/computer-generated English translation).

Office Action mailed Aug. 17, 2024 in Chinese Application No. 202111267961.5 filed Oct. 29, 2021.

* cited by examiner

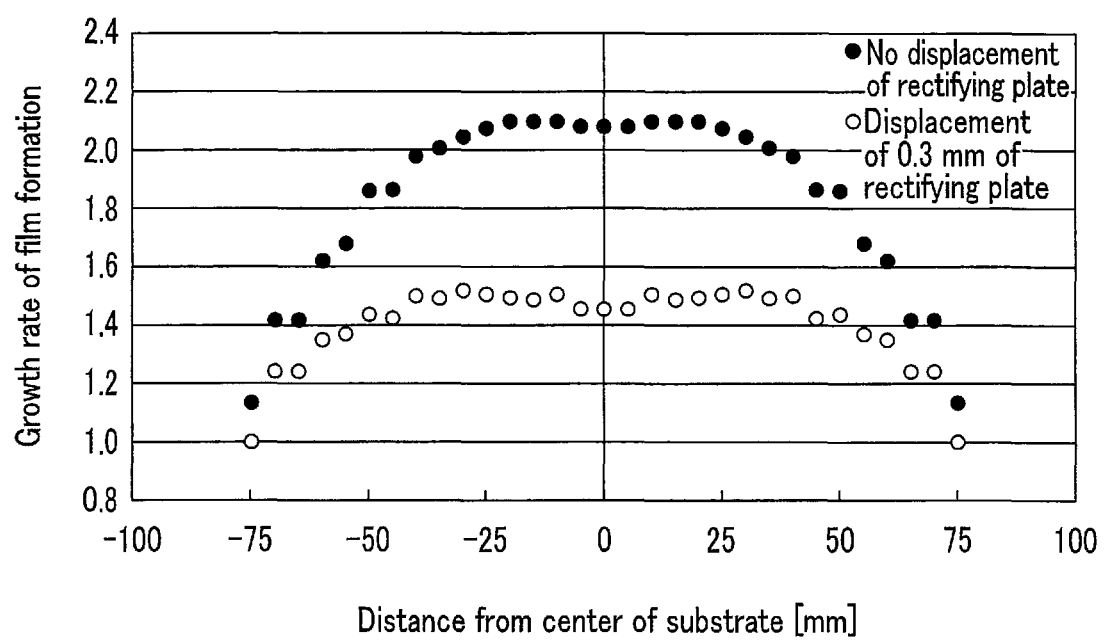
F I G. 14

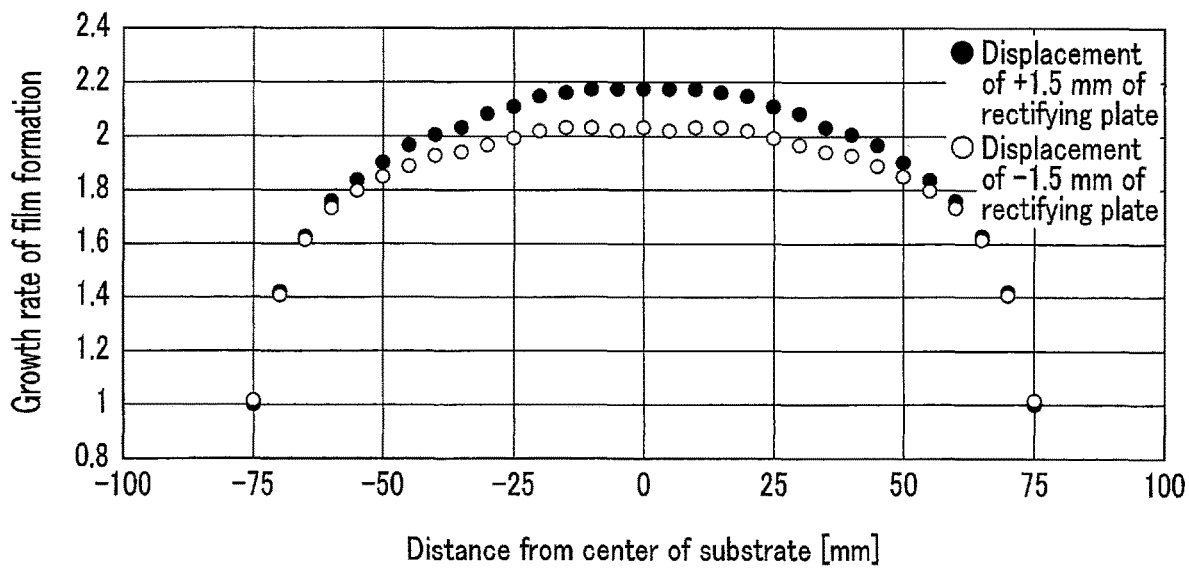
F I G. 20
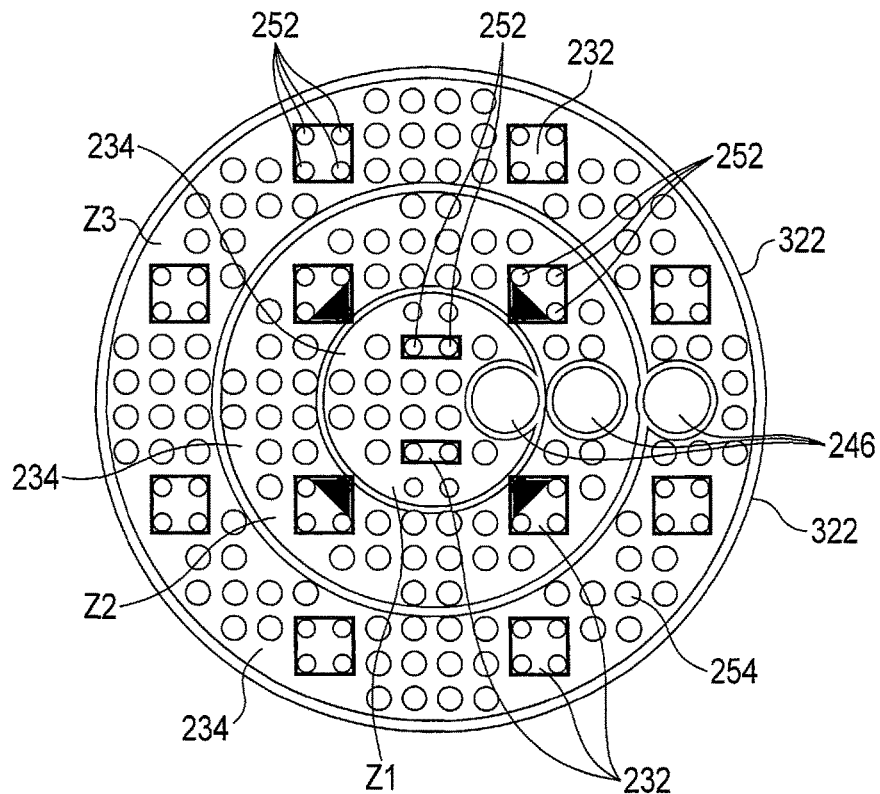
F I G. 21

From center to edge
$$\sum_i \left| \frac{\text{Growth rate of film formation at position (i)(X+1.5mm)} - \text{Growth rate of film formation at position (i)(X-1.5mm)}}{\text{Average of growth rate of film formation (X+1.5 mm)} \times 16} \right| \times 100 \quad (\%)$$

Relative upward speed
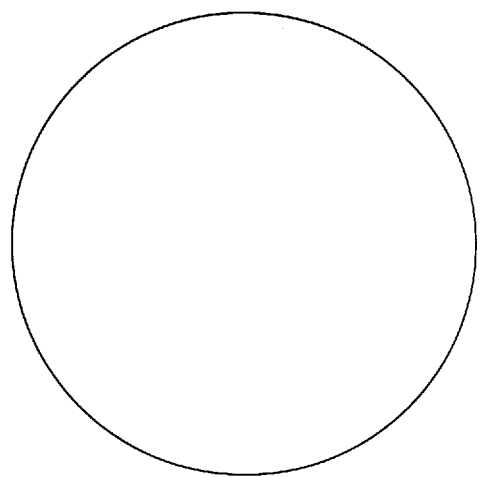
F I G. 25
Relative upward speed
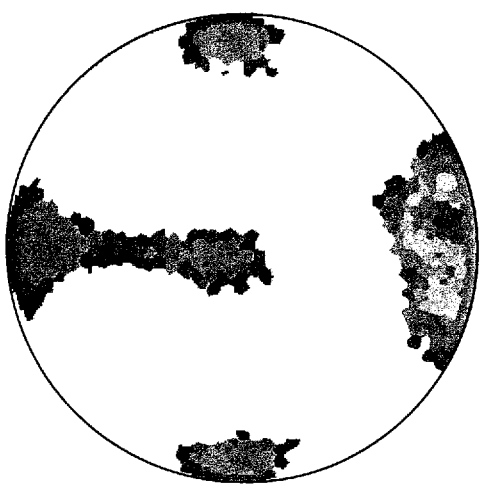
F I G. 26

RECTIFYING PLATE, FLUID-INTRODUCING APPARATUS, AND FILM-FORMING APPARATUS

CROSS-REFERENCE TO RELATED APPLICATIONS

This application is based upon and claims the benefit of priority from Japanese Patent Applications No. 2020-182540, filed Oct. 30, 2020, and No. 2021-175156, filed Oct. 27, 2021, the entire contents of all of which are incorporated herein by reference.

FIELD

Embodiments described herein relate generally to a rectifying plate, a fluid-introducing apparatus including the rectifying plate, and a film-forming apparatus including the fluid-introducing apparatus.

BACKGROUND

There is known a fluid-introducing apparatus which injects a gas from nozzles and introduces the gas into a chamber through a rectifying plate including flow paths. In addition, there is known a film-forming apparatus which introduces a gas into the chamber by using the fluid-introducing apparatus, and forms a film on a substrate such as a wafer.

BRIEF DESCRIPTION OF THE DRAWINGS

FIG. 14 is a graph illustrating a relationship between a distance from the central axis of the substrate illustrated in FIG. 11 and FIG. 13 of the film-forming apparatus of the first comparative example, and the growth rate.

FIG. 20 is a graph illustrating a relationship between a distance from a central axis of the substrate and a time-averaged growth rate in the film-forming apparatus according to the second embodiment when the rectifying plate is disposed with a displacement relative to the reference position of the chamber.

FIG. 21 is a schematic top view illustrating a rectifying plate according to a first modification of the second embodiment.

FIG. 25 is a contour diagram illustrating that no updraft of a gas is generated in a chamber immediately below the rectifying plate when forming a film on a substrate in a state where the rectifying plate is attached to a reference position of a chamber illustrated in FIG. 24.

FIG. 26 is a contour diagram illustrating updraft of a gas immediately below the rectifying plate in the chamber when forming a film on the substrate in a state where the rectifying plate illustrated in FIG. 15 according to the second embodiment is attached to the reference position of the chamber.

DETAILED DESCRIPTION

According to one embodiment, a rectifying plate is opposed to a plurality of nozzles which are configured to inject a fluid. The rectifying plate is configured to rectify the fluid. The rectifying plate includes: a plurality of high flow path resistance areas, and a low flow path resistance area. Each of the high flow path resistance areas includes a nozzle-facing area which is opposed to one of the plurality of nozzles. The low flow path resistance area surrounds each of the plurality of high flow path resistance areas. The low flow path resistance area includes a plurality of first through-holes to allow the fluid to pass through and having a smaller flow path resistance of the fluid than that of the high flow path resistance area.

An object of the present embodiments is to provide a rectifying plate, a fluid-introducing apparatus, and a film-forming apparatus, which is adapted to suppress a variation in growth rate of film formation on a film formation target.

Hereinafter, first and second embodiments will be described with reference to the accompanying drawings.

First Embodiment

Figure 1:
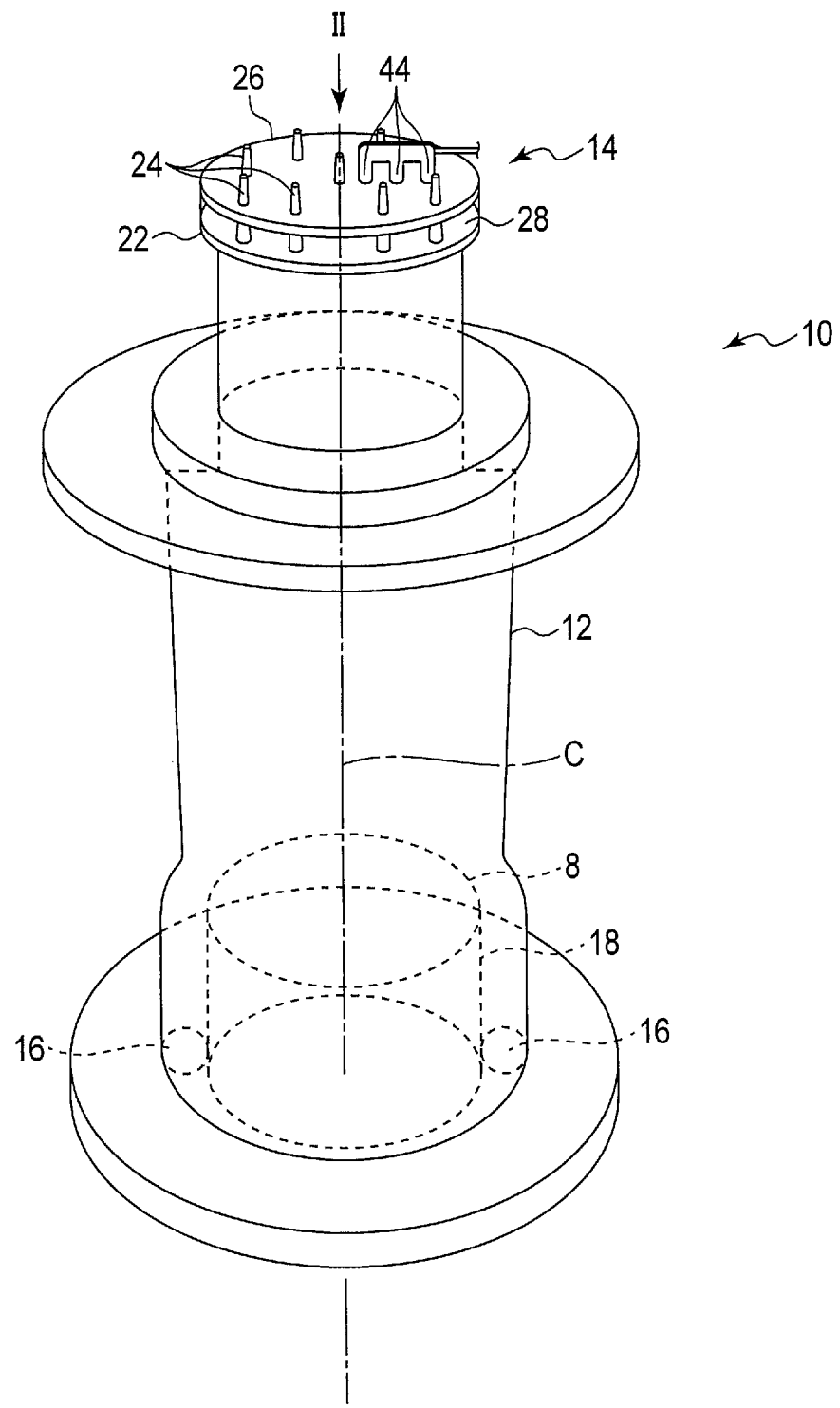
FIG. 1 is a schematic perspective view illustrating a film-forming apparatus according to a first embodiment, a first comparative example, and a second embodiment.

FIG. 1 illustrates a film-forming apparatus 10 which grows a single-crystal epitaxial film on a surface of a substrate 8 such as a wafer, for example, by using a CVD (Chemical Vapor Deposition) method. The film-forming apparatus 10 includes a chamber 12 having, for example, a cylindrical shape; a fluid-introducing apparatus (rectifying apparatus) 14 detachably fixed to one end (an upper part) of the chamber 12; an exhaust portion 16 provided at the other end (a lower part) of the chamber 12; and a rotation stage 18 of the substrate 8, the rotation stage 18 being provided within the chamber 12.

One end of the chamber 12 is located at an upper end of the chamber 12, and the other end of the chamber 12 is located at a lower end of the chamber 12. It is preferable that the chamber 12 is formed in rotation symmetry with respect to a central axis C. The fluid-introducing apparatus 14 fixed to the one end of the chamber 12. The exhaust portion 16 is provided at the other end of the chamber 12. The inside of the chamber 12 may be set at an atmospheric pressure, or may be set at a pressure lower than the atmospheric pressure by, for example, a suction pump (not illustrated) or the like connected to the exhaust portion 16. The description here is given on the assumption that the inside of the chamber 12 is set at a pressure lower than the atmospheric pressure.

The rotation stage 18 is provided in a lower part of the chamber 12. The rotation stage 18 can hold the substrate 8. The rotation stage 18 can be rotated by a motor (not illustrated) or the like, relative to the chamber 12, around the central axis C of the chamber 12. It is preferable that the rotational axis of the rotation stage 18 agrees with the central axis C of the chamber 12. Thus, the film-forming apparatus 10 can rotate the substrate 8 at a rotational speed of 1000 rpm, for example, by rotating the rotation stage 18 around the central axis C of the chamber 12 at a rotational speed of 1000 rpm in the state in which the substrate 8 is held on the rotation stage 18.

Note that in the present embodiment, the substrate 8 is discoidal with a diameter of, for example, 6 inches (approximately 150 mm).

The fluid-introducing apparatus 14 includes a rectifying plate 22 which rectifies a fluid; and a plurality of nozzles 24 which are configured to inject a plurality of kinds of gases toward the rectifying plate 22 from a gas source (not illustrated) on the outside of the film-forming apparatus 10. The rectifying plate 22 is opposed to the nozzles 24 which are configured to inject fluids. Note that, in one example, the fluid-introducing apparatus 14 includes a cover (closing plate) 26 which prevents leakage of gas. The plurality of nozzles 24 penetrate the cover 26. Sealing is effected between an outer peripheral surface of each nozzle 24 and the cover 26. That is, in order to prevent leakage of the gas introduced into the film-forming apparatus 10, the one end of the chamber 12 is closed by the cover 26 of the fluid-introducing apparatus 14. The fluid-introducing apparatus 14 includes a space (fluid-introducing part) 28, into which the gas is supplied, between the cover 26 and the rectifying plate 22.

Figure 2:
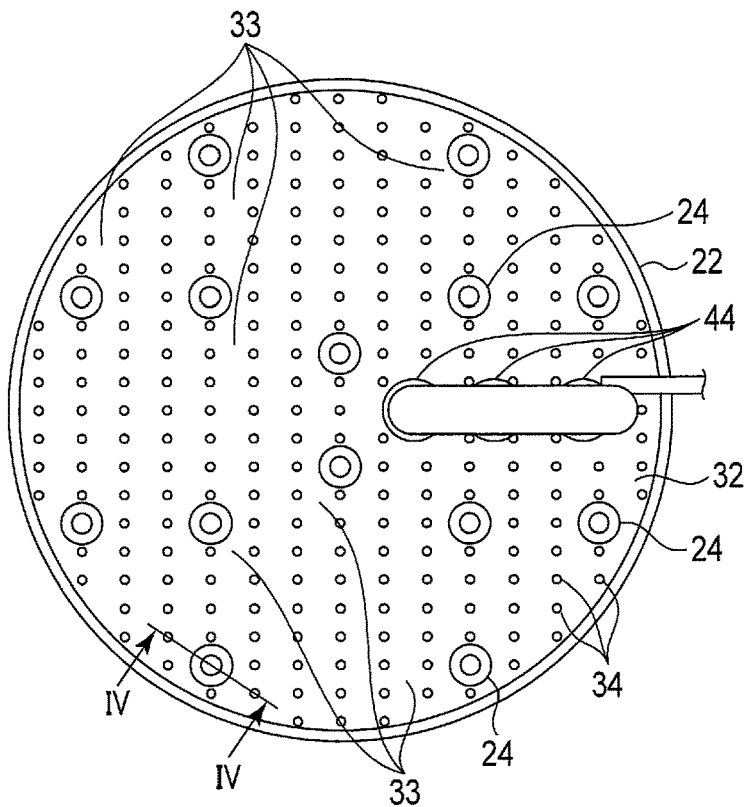
FIG. 2 is a top view illustrating the film-forming apparatus according to the first and second embodiments, as viewed in a direction of an arrow II in FIG. 1.
Figure 3:
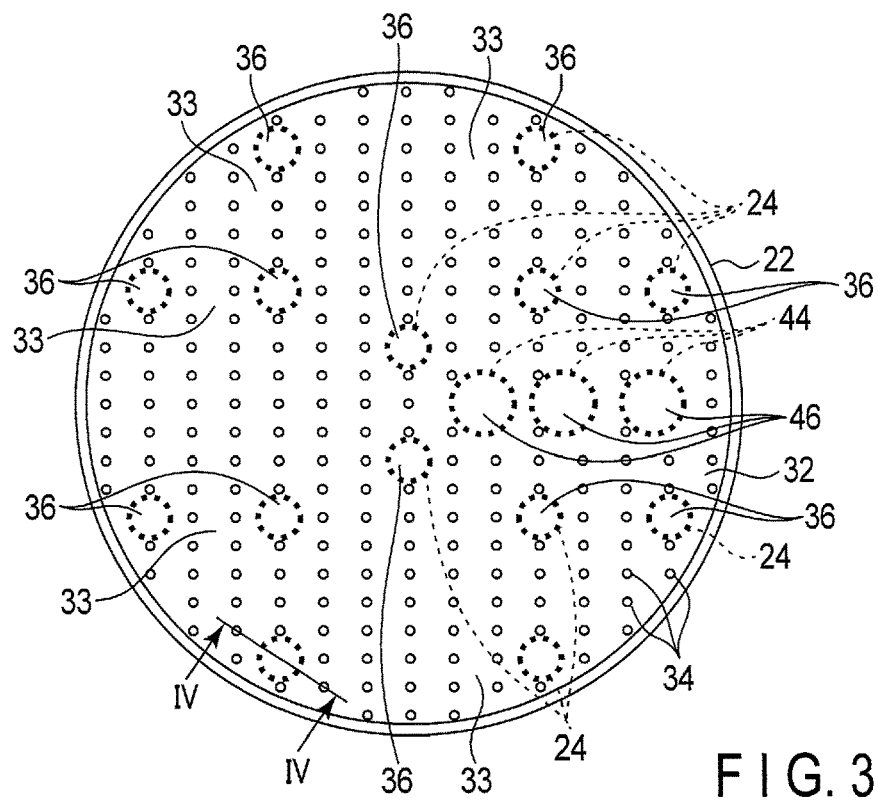
FIG. 3 is a schematic view illustrating a positional relationship between a rectifying plate and nozzles of a fluid-introducing apparatus illustrated in FIG. 2 of the film-forming apparatus according to the first and second embodiments.
Figure 4:
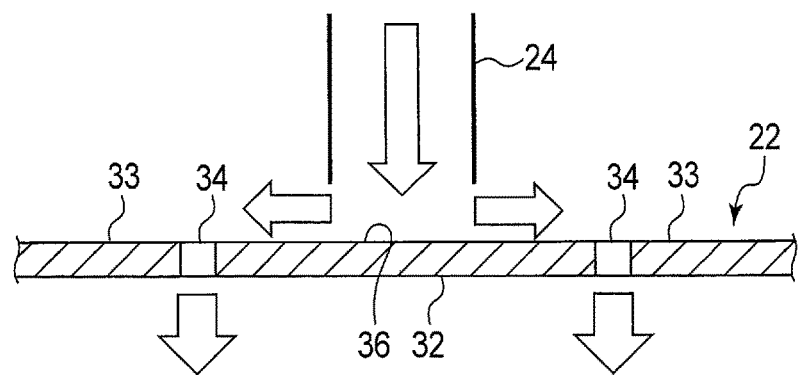
FIG. 4 is a cross-sectional view taken along line IV-IV in FIG. 2 and FIG. 3.
Figure 5:
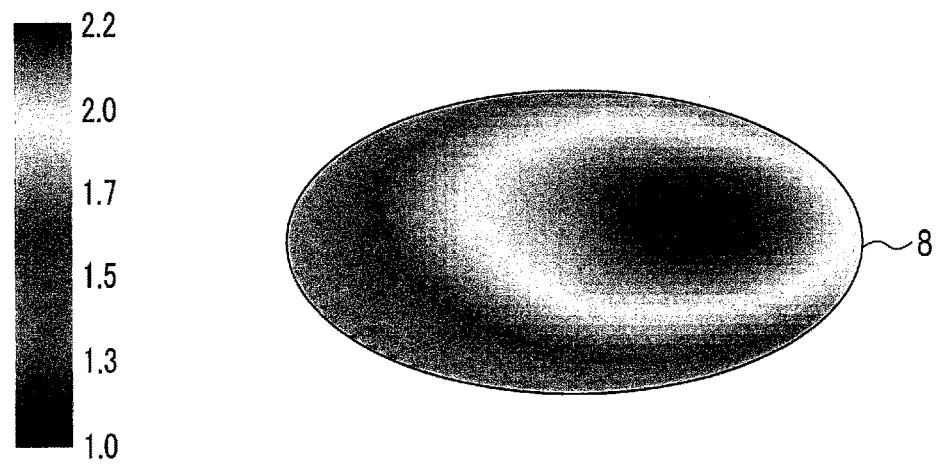
FIG. 5 is a schematic perspective view illustrating a growth rate distribution on a substrate at rest of the film-forming apparatus according to the first embodiment.
Figure 6:
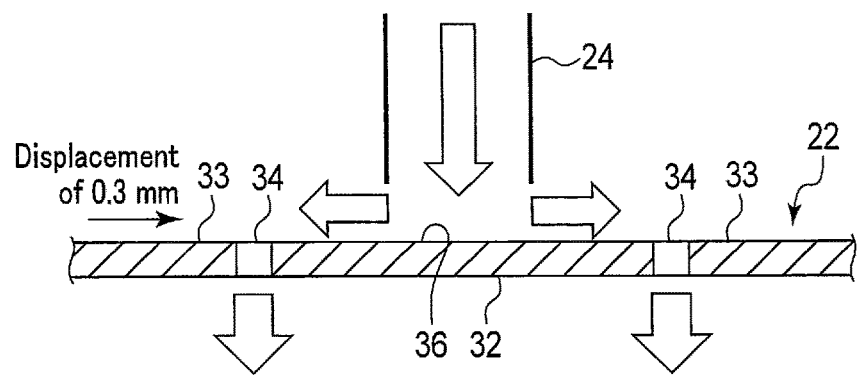
FIG. 6 is a schematic cross-sectional view illustrating a positional relationship between the rectifying plate and the nozzle at a time when the rectifying plate of the fluid-introducing apparatus according to the first embodiment is attached with a displacement of 0.3 mm relative to a reference position of a chamber.
Figure 7:
FIG. 7 is a schematic perspective view illustrating a growth rate distribution on the substrate at rest of the film-forming apparatus according to the first embodiment.

FIG. 2 is a top view illustrating the nozzles 24 and the rectifying plate 22, as viewed in a direction of an arrow II in FIG. 1 in the film-forming apparatus 10 according to the first embodiment. FIG. 3 is a schematic view of the rectifying plate 22, with positions of the nozzles 24 illustrated in FIG. 2 being depicted on the rectifying plate 22 by broken lines. FIG. 4 is a schematic cross-sectional view taken along line IV-IV in FIG. 2 and FIG. 3, FIG. 4 illustrating a positional relationship between the rectifying plate 22 and the nozzle 24 in the film-forming apparatus 10 of the first embodiment, at a time when the rectifying plate 22 is attached to a reference position relative to the chamber 12. FIG. 5 is a perspective view illustrating a growth rate distribution on the substrate 8 at a time when a film is formed on the substrate 8 at rest in the state in which the rectifying plate 22 illustrated in FIG. 4 is attached to the one end of the chamber 12 of the film-forming apparatus 10 illustrated in FIG. 1. FIG. 6 is a schematic cross-sectional view illustrating a positional relationship between the rectifying plate 22 and the nozzle 24 at a time when the rectifying plate 22 is attached to the chamber 12 with a displacement of 0.3 mm, which is in a range of tolerable errors, relative to the reference position. FIG. 7 is a perspective view illustrating a growth rate, distribution on the substrate 8 at a time when a film is formed on the substrate 8 at rest in the state in which the rectifying plate 22 illustrated in FIG. 6 is attached to the one end of the chamber 12 of the film-forming apparatus 10 illustrated in FIG. 1.

As illustrated in FIG. 2, FIG. 3, FIG. 4, and FIG. 6, the rectifying plate 22 is formed of a light-transmitting material, such as quarts, in a discoidal shape. It is preferable that the central axis of the rectifying plate 22, the central axis C of the chamber 12 illustrated in FIG. 1, and the rotational axis of the rotation stage 18 agree with each other. In the example illustrated in FIG. 4, the central axis of the rectifying plate 22, the central axis C of the chamber 12, and the rotational axis of the rotation stage 18 agree with each other. However, in the example illustrated in FIG. 6, the central axis of the rectifying plate 22 is parallel to the central axis C of the chamber 12 and the rotational axis of the rotation stage 18, but is displaced by 0.3 mm relative to the central axis C of the chamber 12 and the rotational axis of the rotation stage 18.

In the present embodiment, the diameter of the rectifying plate 22 is, for example, 186 mm which is approximately 1.2 times greater than the diameter of the substrate 8. Note that the inside diameter of the region in the chamber 12 between the one end of the chamber 12 and the rotation stage 18 is set to be equal to the diameter of the rectifying plate 22, or to be greater than the diameter of the rectifying plate 22.

The rectifying plate 22 is detachably fixed to the one end of the chamber 12. The rectifying plate 22 is replaceable. At this time, an allowable error at a time when the rectifying plate 22 is fixed to the one end of the chamber 12 is a predetermined dimension, for example, ±0.3 mm in the radial direction with respect to the central axis C.

As illustrated in FIG. 2 and FIG. 3, the rectifying plate 22 includes a closing portion (high flow path resistance area where the flow path resistance is infinite) 32 and a low flow path resistance area 33 including a plurality of through-holes (first through-holes) 34 which surrounds the closing portion (high flow path resistance area) 32. Each of the plurality of through-holes 34 is formed as a gas flow path. The flow path resistance mentioned herein is a force by which a flow of a fluid is interrupted due to a certain shape of a flow path when the fluid passes through the flow path.

For example, the plurality of through-holes 34 are basically formed at predetermined intervals (with a predetermined pitch), but there are partial areas where the intervals are different. Each of the opening amounts (opening diameters) of the through-holes 34 are preferably equal, but may be different. Each of the opening amount is set as appropriate, for example, in a range of diameters of approximately 2.6 mm to approximately 3.5 mm. It is preferable that the sizes of through-holes 34 and the number of through-holes 34 per unit area are unchanged from a central axis area to a peripheral area of the rectifying plate 22. The through-holes 34 are arranged, for example, in lattice-like positions. The pitch width of the through-holes 34 is, for example, 8 mm.

Note that, of the through-holes 34 of the rectifying plate 22, through-holes 34, which are located near the outer periphery remotest from the central axis of the rectifying plate 22, are preferably located immediately above the outer periphery of the substrate 8, or located more outward than the outer periphery of the substrate 8. In this case, a film can easily be formed uniformly even at positions of the outer periphery of the substrate 8.

The nozzle 24 illustrated in FIG. 4 and FIG. 6 is disposed, for example, in such a manner as to inject a gas for film formation in parallel to the central axis of the rectifying plate 22. In the present embodiment, it is preferable that the directions of gas inject by the nozzles 24 are parallel to the central axis C of the chamber 12.

As illustrated in FIG. 2, FIG. 3, FIG. 4, and FIG. 6, each nozzle 24 is opposed to the closing portion (high flow path resistance area) 32 in such a manner as to inject a fluid toward the closing portion (high flow path resistance area) 32. A distal end of each nozzle 24 and the closing portion (high flow path resistance area) 32 are spaced apart. The closing portion (high flow path resistance area) 32 is an area toward which a gas is directly injected from the nozzle 24. The closing portion (high flow path resistance area) 32 varies depending on the shape of the nozzle 24, a flow rate of a injected fluid such as a gas, a spray angle, which is an angle at which a injected fluid such as a gas spreads, a spray width, which is a width of a injected gas at the distance a injected fluid such as a gas reaches from the distal end of the nozzle 24, and a spray pattern, which is a cross-sectional shape when a injected fluid such as a gas diffuses, etc. On the other hand, the low flow path resistance area 33 including a plurality of through-holes 34 that is an area other than the closing portion (high flow path resistance area) 32 is an area toward which a gas is not directly injected from the nozzle 24. In the low flow path resistance area 33, of the through-holes (first through-holes) 34, a through-hole 34 which is closest to a nozzle-facing area 36 opposed to the distal end of the nozzle 24 is disposed at a position where a gas injected from the nozzle 24 is indirectly introduced in the through-hole 34. That is, the through-holes 34 are formed outside the spray pattern formed by the gas injected from the nozzle 24, in consideration of, for example, the relation with the spray angle at the distance (spray distance) between the nozzle 24 and the rectifying plate 22. Out of the through-holes 34, a through-hole 34 which is closest to the nozzle-facing area 36 is disposed in an area excluding the spray pattern at the spray distance which is defined as the distance between the distal end of the nozzle 24 and the closing portion 32.

That is, the closing portion (high flow path resistance area) 32 includes the nozzle-facing area 36 (see FIG. 3, FIG. 4 and FIG. 6) which is opposed to the nozzle 24. The nozzle-facing area 36 is located in the area excluding the through-holes 34, and is formed through-holeless. Thus, no through-hole 34 is provided in the nozzle-facing area 36. In other words, in the fluid-introducing apparatus 14, the nozzles 24 which are configured to inject fluids are disposed at positions not opposed to the through-holes 34. The nozzle-facing areas 36 are formed in areas where the intervals of the through-holes 34, which are basically formed regularly (at regular intervals), are different.

Note that the opening diameter of the nozzle 24 is, for example, 13 mm.

In the present embodiment, as illustrated in FIG. 2 and FIG. 3, the rectifying plate 22, when viewed from an upper side, is formed line-symmetrically with respect to a virtual line (X axis) extending outward in the radial direction from the central axis of the rectifying plate 22 and passing through centers of three pyrometer-use nozzles 44 to be described later. In the present embodiment, the through-holes 34 are formed at point-symmetric positions or substantially point-symmetric positions with respect to the central axis of the rectifying plate 22, or at line-symmetric positions or substantially line-symmetric positions with respect to a predetermined axis passing through the central axis of the rectifying plate 22 along the closing portion (high flow path resistance area) 32.

Note that, in the present embodiment, the fluid-introducing apparatus 14 includes pyrometer-use nozzles 44 for indirectly monitoring the temperature of the substrate 8 by a pyrometer. A purge gas is introduced into the pyrometer-use nozzles 44. No through-hole 34 is provided in a position opposed to the pyrometer-use nozzle 44 (a pyrometer-use nozzle-facing area 46 (see FIG. 3)). In other words, in the fluid-introducing apparatus 14, the pyrometer-use nozzles 44 are disposed at positions not facing the through-holes 34. The pyrometer receives light (infrared) radiated from the substrate 8, through the rectifying plate 22 of the light transmitting material and the pyrometer-use nozzles 44, and measures temperatures.

Note that the opening diameter of the pyrometer-use nozzle 44 is, for example, 13 mm, which is substantially equal to the opening diameter of the nozzle 24. The opening diameter of the pyrometer-use nozzle 44 may be greater than, or less than, the opening diameter of the nozzle 24.

Next, an operation of the fluid-introducing apparatus 14 of the film-forming apparatus 10 according to the first embodiment will be described.

While the substrate 8 on the rotation stage 18 illustrated in FIG. 1 is being rotated at a speed of, e.g. 1000 rpm, gases as a plurality of kinds of fluids are injected from the nozzles 24 toward the closing portion (high flow path resistance area) 32 of the rectifying plate 22 of the fluid-introducing apparatus 14. At this time, it is preferable that the through-holes 34 are located outside the ranges of the spray patterns of the plural kinds of gasses. In addition, as illustrated in FIG. 4, after each of the plural kinds of gases injected toward the closing portion 32 reaches the closing portion 32 on the surface of the rectifying plate 22 at a predetermined spray angle, the gas radially spreads from the closing portion 32, and reaches the through-holes 34.

Note that, for example, heat is used as energy for causing chemical reactions of the gases in the chamber 12.

The gases, which are caused to flow toward the through-holes 34 from the closing portion (high flow path resistance area) 32, flow from the one end of the chamber 12 toward the other end of the chamber 12 through the through-holes 34. Then, with the fluids flowing into the chamber 12 through the through-holes 34 of the fluid-introducing apparatus 14, the plural kinds of gases are introduced into the chamber 12 and a film is formed on the substrate 8.

In the above-described example illustrated in FIG. 4, the rectifying plate 22 is disposed at a reference position (a normal attachment position). On the other hand, in the example illustrated in FIG. 6, the rectifying plate 22 is disposed with a displacement of 0.3 mm from the reference position.

FIG. 5 illustrates a simulation result of a growth rate distribution on the substrate 8 at a time when the rectifying plate 22 is attached to the reference position of the chamber 12 in FIG. 4. FIG. 7 illustrates a simulation result of a growth rate distribution on the substrate 8 at a time when the rectifying plate 22 is attached with an error of 0.3 mm from the reference position of the chamber 12 in FIG. 6. The growth rate distributions in FIG. 5 and FIG. 7 show relative growth rates at a time when the lowest growth rate in FIG. 5 is set at 1.0. Note that the simulation results illustrated in FIG. 5 and FIG. 7 are results at a time when films are formed in the state in which the substrate 8 is at rest, without the rotation stage 18 being rotated. As is understood, each of the simulation results indicates similar tendencies, with the growth rate increasing at positions slightly displaced from the center of the substrate 8.

Figure 8:
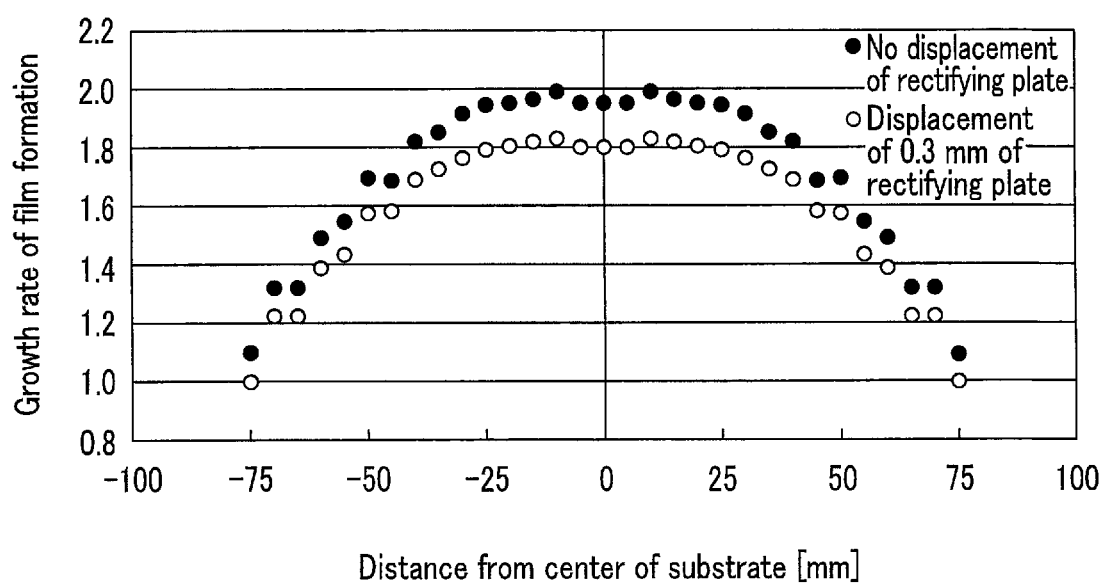
FIG. 8 is a graph illustrating a relationship between a distance from a central axis of the substrate illustrated in FIG. 5 and FIG. 7 of the film-forming apparatus according to the first embodiment, and the growth rate.

In addition, the growth rates in the substrates 8 in the example illustrated in FIG. 4 and the example illustrated in FIG. 6 were simulated as illustrated in FIG. 8. When the case of FIG. 4 where the rectifying plate 22 is attached to the reference position (normal attachment position) without an error relative to the one end of the chamber 12 (plotting by black circles) is compared with the case of FIG. 6 where the rectifying plate 22 is attached with an error of 0.3 mm from the reference position (normal attachment position) relative to the one end of the chamber (plotting by white circles), it is understood that there is no large variation between both cases. At this time, a variation rate of the growth rate at the central part of the substrate 8 was suppressed to approximately 6%.

First Comparative Example

Referring to FIG. 9 to FIG. 14, a rectifying plate 122 of a first comparative example will be described.

Figure 9:
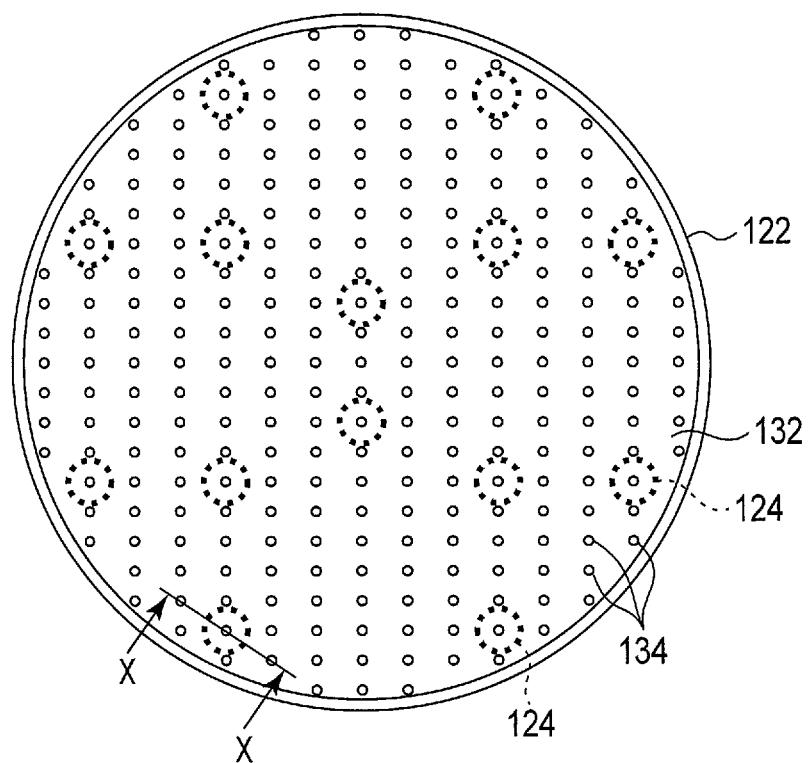
FIG. 9 is a schematic view illustrating a positional relationship between a rectifying plate and nozzles of a fluid-introducing apparatus of a film-forming apparatus according to the first comparative example.
Figure 10:
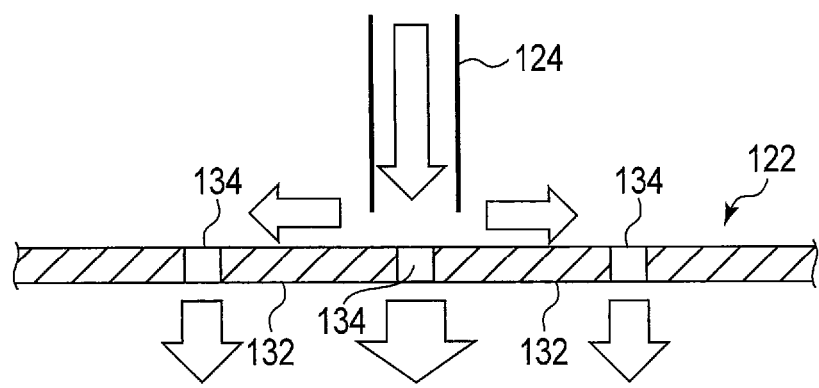
FIG. 10 is a cross-sectional view taken along line X-X in FIG. 9 according to the first comparative example.
Figure 12:
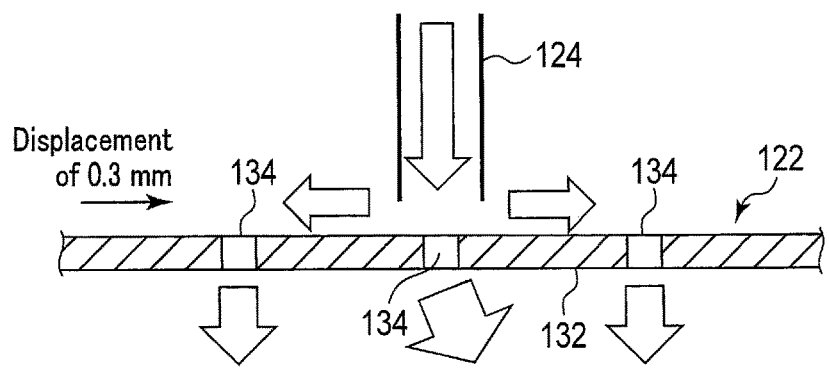
FIG. 12 is a schematic cross-sectional view illustrating a positional relationship between the rectifying plate and the nozzle at a time when the rectifying plate of the fluid-introducing apparatus of the first comparative example is attached with a displacement of 0.3 mm relative to a reference position of the chamber.

As illustrated in FIG. 9, FIG. 10 and FIG. 12, the first comparative example is the same as the above-described first embodiment, except that the positional relationship between the rectifying plate 122 and nozzles 124 of the fluid-introducing apparatus 14 is different.

FIG. 9 illustrates a positional relationship between the rectifying plate 122 and nozzles 124 of the first comparative example of the fluid-introducing apparatus 14. FIG. 10 is a schematic cross-sectional view taken along line X-X in FIG. 9, FIG. 10 illustrating a positional relationship between the rectifying plate 122 and the nozzle 124 in the film-forming apparatus 10 of the first comparative example, at a time when the rectifying plate 122 is attached to the reference position relative to the chamber 12. FIG. 12 is a schematic cross-sectional view illustrating a positional relationship between the rectifying plate 122 and the nozzle 124 at a time when the rectifying plate 122 is attached to the one end of the chamber 12 of the film-forming apparatus, with a displacement of 0.3 mm, which is in a range of tolerable errors, relative to the reference position.

Unlike the first embodiment, in the first comparative example, each nozzle 124 is opposed to not a closing portion (high flow path resistance area) 132 but a through-hole 134, as illustrated in FIG. 9, FIG. 10 and FIG. 12. Therefore, the through-hole 134 is formed immediately below the nozzle 124. In the case of FIG. 10, in which a positional relationship between the nozzle 124 and the rectifying plate 122 is a predetermined position and there is no displacement, it is preferable that a central axis of the nozzle 124 and a central axis of the through-hole 134 be coaxial.

Figure 11:
FIG. 11 is a schematic perspective view illustrating a growth rate distribution on a substrate at rest of the film-forming apparatus of the first comparative example.
Figure 11:
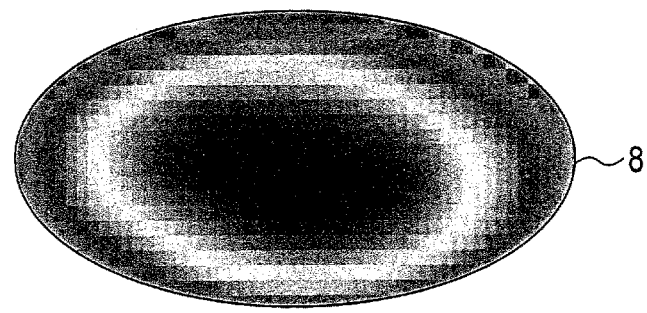
Figure 13:
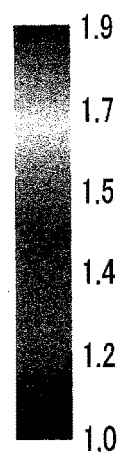
FIG. 13 is a schematic perspective view illustrating a growth rate distribution on the substrate at rest of the film-forming apparatus of the first comparative example.
Figure 13:
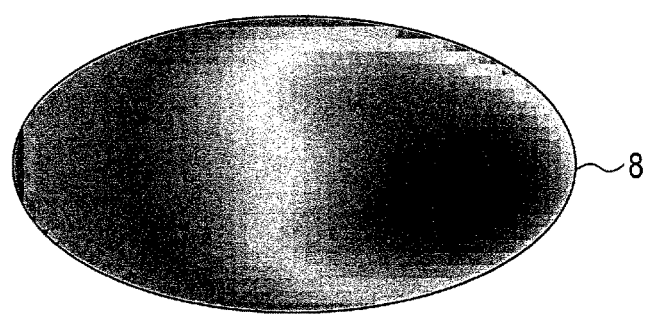

FIG. 11 is a perspective view illustrating a simulation result of a growth rate distribution on the substrate 8 at a time when the rectifying plate 122 is attached to the reference position without an error, relative to the one end of the chamber 12 in FIG. 10. FIG. 13 is a perspective view illustrating a simulation result of a growth rate distribution on the substrate 8 at a time when the rectifying plate 122 is attached with an error of 0.3 mm from the reference position, relative to the one end of the chamber 12 in FIG. 12. The growth rate distributions in FIG. 11 and FIG. 13 show relative growth rates at a time when the lowest growth rate in FIG. 13 is set at 1.0. Note that the simulation results illustrated in FIG. 11 and FIG. 13 are results at a time when films are formed in the state in which the substrate 8 is at rest, without the rotation stage 18 being rotated. As is understood, the growth rate distribution increases at the center of the substrate 8 in FIG. 11, while the growth rate distribution increases at a position slightly displaced from the center of the substrate 8 in FIG. 13. The simulation results of the growth rate distributions illustrated in FIG. 11 and FIG. 13 have different tendencies.

In addition, the growth rates in the substrates 8 in the example illustrated in FIG. 10 and the example illustrated in FIG. 12 were simulated. As illustrated in FIG. 14, in the case where the rectifying plate 122 is attached to the reference position without an error relative to the one end of the chamber 12 (plotting by black circles), the growth rate is higher than in the case where the rectifying plate 122 is attached with an error of 0.3 mm from the reference position (plotting by white circles), and the growth rate greatly varies. At this time, the variation rate of the growth rate at the central part of the substrate 8 was approximately 20%.

Comparison Between the First Embodiment and the First Comparative Example

In the first comparative example, since the through-hole 134 is formed immediately below the nozzle 124, part of the gas injected from the nozzle 124 directly passes through the through-hole 134. In addition, when the rectifying plate 122 is attached to the chamber 12 with a displacement of 0.3 mm from the reference position, the relative position between the nozzle 124 and the through-hole 134 of the rectifying plate 122 is displaced, and consequently the direction, speed and the like of the flow of the gas, which directly passes through the through-hole 134 from the nozzle 124 and is introduced into the chamber 12, vary. Thus, it is considered that a difference of 20% occurs in the growth rate at the center of the substrate 8.

On the other hand, in the present embodiment, since the closing portion (high flow path resistance area) 32 is formed immediately below the nozzle 24, the gas injected from the nozzle 24 does not directly pass through the through-hole 34. Instead, the gas reaches the closing portion (high flow path resistance area) 32, radially spreads, and then passes through the through-holes 34 and enters the chamber 12. Thus, even when the rectifying plate 22 is attached to the chamber 12 with a displacement of 0.3 mm from the reference position, and the relative position between the nozzle 24 and the through-hole 34 of the rectifying plate 22 is displaced by 0.3 mm, the variation in the growth rate due to the displacement can be suppressed to approximately 6%.

Accordingly, with the film-forming apparatus 10, the fluid-introducing apparatus 14, and the rectifying plate 22 according to the present embodiment, it is possible to suppress variations in the growth rate on the substrate 8 due to an error in attaching the rectifying plate 22 to the chamber 12.

The fluid-introducing apparatus 14 of the present embodiment can be used not only at a time of injecting a gas, but also at a time of injecting a liquid from the nozzle 24.

In the present embodiment, the example in which the rectifying plate 22 is discoidal was described. The shape of the rectifying plate 22 is not limited to the discoidal shape. The shape of the rectifying plate 22 may be various shapes such as an elliptic shape and a rectangular shape.

According to the present embodiment, there can be provided the rectifying plate 22 which can suppress a variation in the growth rate of film formation on a film-formation target before and after the replacement of the rectifying plate 22 by, for example, maintenance; the fluid-introducing apparatus 14 including the rectifying plate 22; and the film-forming apparatus 10 including the fluid-introducing apparatus 14.

Second Embodiment

Next, the second embodiment will be described with reference to FIGS. 15 to 20. The second embodiment is a modification of the first embodiment, and the same members or members having the same function as those described in the first embodiment are denoted by the same reference numerals as much as possible, and detailed descriptions thereof will be omitted.

Figure 15:
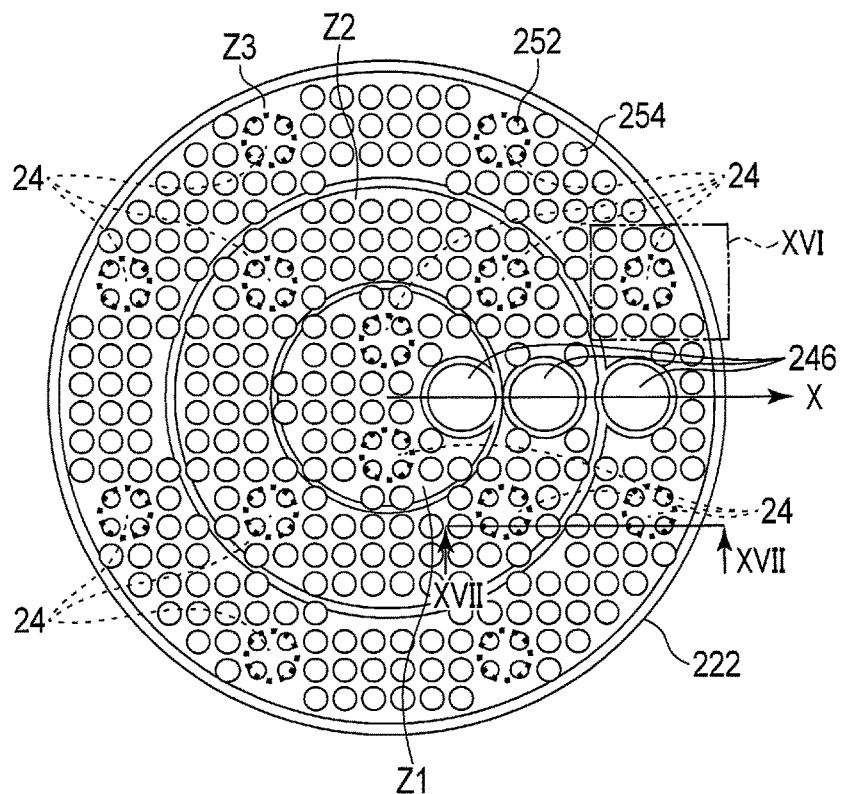
FIG. 15 is a schematic top view illustrating a rectifying plate of a fluid-introducing apparatus of a film-forming apparatus according to a second embodiment.
Figure 16:
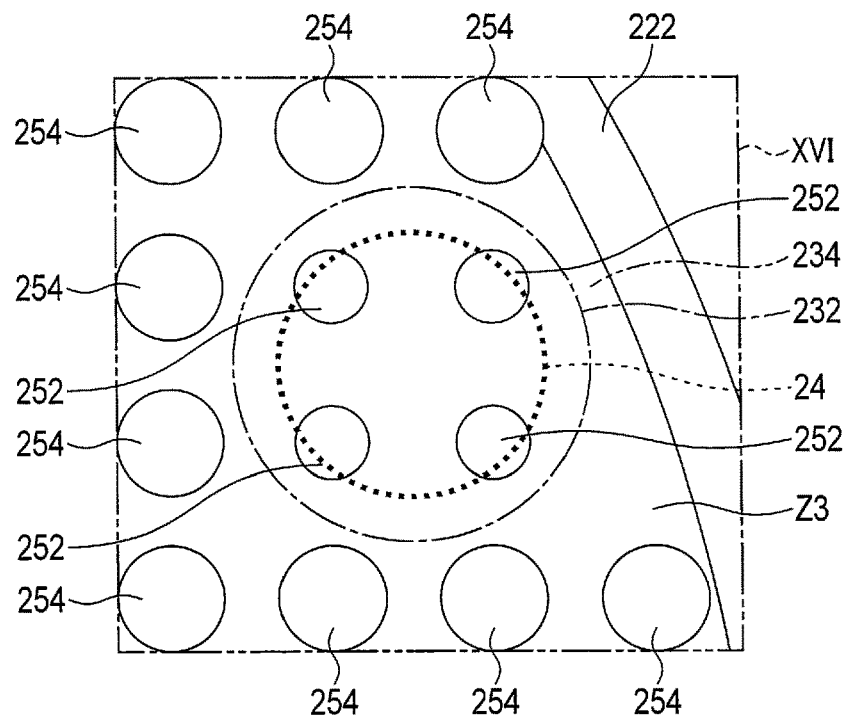
FIG. 16 is a diagram illustrating a position indicated by a reference sign XVI in FIG. 15.
Figure 17:
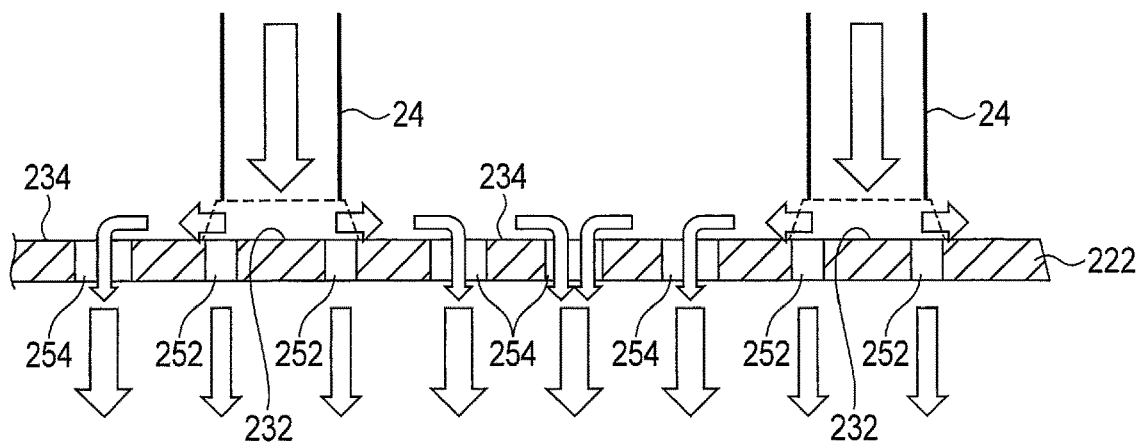
FIG. 17 is a cross-sectional view taken along line XVII-XVII in FIG. 15.

FIG. 15 shows a schematic top view illustrating a rectifying plate 222 of a fluid-introducing apparatus 14 of a film-forming apparatus 10 according to the second embodiment. FIG. 16 shows a diagram illustrating a position indicated by a reference sign XVI in FIG. 15. FIG. 17 illustrates a cross-sectional view taken along line XVII-XVII in FIG. 15.

In the present embodiment, an example will be described in which the rectifying plate 222 is used instead of the rectifying plate 22 of the fluid-introducing apparatus 14 of the film-forming apparatus 10 described in the first embodiment. The fluid-introducing apparatus 14 of the film-forming apparatus 10 according to the present embodiment includes the rectifying plate 222, which rectifies a fluid; a plurality of nozzles 24 which inject a plurality of kinds of gases from a gas source toward the rectifying plate 222; and a plurality of pyrometer-use nozzles.

As illustrated in FIG. 15, the rectifying plate 222 according to the present embodiment has the same size as that of the rectifying plate 22 described in the first embodiment and is, for example, in a discoid shape. The rectifying plate 222 includes, for example, three purge gas flow paths 246. The pyrometer-use nozzles into which a purge gas is introduced are disposed immediately above the purge gas flow paths 246 of the rectifying plate 222. The purge gas flow paths 246 are disposed, for example, at substantially equal intervals from a central axis of the rectifying plate 222 along a certain radial direction. A central axis of each purge gas flow path 246 is located on a +X axis originating from the central axis of the rectifying plate 222. Through the purge gas flow paths 246, an argon gas or a hydrogen gas, for example, as the purge gas is passed into the chamber 12 through the rectifying plate 222. Thus, the purge gas is supplied into the chamber 12 through the purge gas flow paths 246. In the present embodiment, an opening diameter of each purge gas flow path 246 is, for example, 18 mm.

As illustrated in FIG. 16, the rectifying plate 222 includes a high flow path resistance area 232 including a nozzle-facing area which is opposed to the nozzle 24 and a low flow path resistance area 234 which surrounds the high flow path resistance area 232. In the rectifying plate 222, a plurality of through-holes 252 and 254 are disposed with a constant pitch as flow paths to allow a reaction gas for film formation to pass through. In the rectifying plate 222, the low flow path resistance area 234 may be formed outside the high flow path resistance area 232. In the present embodiment, the through-holes 252 and 254 are, for example, disposed with a pitch of 8 mm. In addition, in the rectifying plate 222, there may be a position at which the through-holes 254 are not formed with a constant pitch. In the rectifying plate 222, there may be a position at which a space between the first through-hole 252 and the second through-hole 254 is not formed with a constant pitch.

Note that, of the through-holes 252 and 254 of the rectifying plate 222, through-holes 252 and 254, which are located near the outer periphery of the rectifying plate 222 remotest from the central axis of the rectifying plate 222, are preferably located immediately above the outer periphery of the substrate 8, or located more outward than the outer periphery of the substrate 8. In this case, a film can easily be formed uniformly even at positions of the outer periphery of the substrate 8.

The high flow path resistance area 232 includes a plurality of first through-holes (second through-holes) 252 having a first diameter. The low flow path resistance area 234 is provided to surround the high flow path resistance area 232 and includes one or more second through-holes (first through-holes) 254 having a second diameter larger in opening ratio than the first through-hole 252 of the high flow path resistance area 232. The first through-hole 252 is formed to have a smaller diameter than that of the second through-hole 254. For example, a diameter of the first through-hole 252 is 5 mm, and a diameter of the second through-hole 254 is 7 mm.

As illustrated in FIG. 15, the rectifying plate 222 includes a first zone Z1, a second zone Z2, and a third zone Z3 from the inside toward the outside. The first zone Z1 is an area inside a disc concentric with the central axis of the rectifying plate 222. The second zone Z2 is an annular area outside the first zone Z1. The third zone Z3 is an annular area outside the second zone Z2. An outer edge of the third zone Z3 coincides with an outer edge of the rectifying plate 222. A distance between the central axis of the rectifying plate 222 and an outer edge (an inner edge of the second zone Z2) of the first zone Z1, a distance between the outer edge of the first zone Z1 and an outer edge (an inner edge of the third zone Z3) of the second zone Z2, and a distance between the outer edge of the second zone Z2 and the outer edge of the third zone Z3 are, for example, equal. Each of the zones Z1, Z2, and Z3 includes the high flow path resistance area 232 and the low flow path resistance area 234. The first through-holes 252 in the first zone Z1, the second zone Z2, and the third zone Z3 have a set of four. In this case, the first through-holes 252 in each of the zones Z1, Z2, and Z3 are at vertices of a square formed by line segments each having a length corresponding to the constant pitch.

As illustrated in FIG. 17, an opening diameter of the nozzle 24 is, for example, 13 mm. As illustrated in FIG. 17, each nozzle 24 is opposed to the high flow path resistance area 232 in such a manner as to inject a fluid toward the high flow path resistance area 232. The distal end of each nozzle 24 and the high flow path resistance area 232 of the rectifying plate 222 are spaced apart. The first through-holes 252 are disposed at positions into which gases injected from the nozzles 24 are directly introduced, although depending on the shape of the nozzles 24, a flow rate of a injected fluid such as a gas, a spray angle, which is an angle at which a injected fluid such as a gas spreads, a spray width, which is a width of a injected gas at the distance a injected fluid such as a gas reaches from the distal end of the nozzle 24, a spray pattern, which is a cross-sectional shape when a injected fluid such as a gas diffuses, etc. Thus, the first through-holes 252 are formed inside an outer edge of the spray pattern formed by the gas injected from the nozzle 24, in consideration of, for example, the relation with the spray angle at the distance (spray distance) between the nozzle 24 and the rectifying plate 222.

It is preferable that the central axis of the nozzle 24 be disposed so as to intersect the center of gravity of a square having the center of each of the first through-holes 252 in a set of four as the apex.

On the other hand, the second through-holes 254 of the low flow path resistance area 234 are disposed at positions where a gas injected from the nozzles 24 is indirectly introduced. The second through-holes 254 are formed outside the outer edge of the spray pattern formed by the gas injected from the nozzle 24, in consideration of, for example, the relation with the spray angle at the distance (spray distance) between the nozzle 24 and the rectifying plate 222. Thus, of the second through-holes 254, a second through-hole 254 which is closest to the high flow path resistance area 232 is formed in an area excluding the spray pattern at the spray distance which is defined as the distance between the distal end of the nozzle 24 and the high flow path resistance area 232.

A positional relationship between the nozzle 24 and the first through-holes 252 is preferably, for example, equidistant from the central axis of the nozzle 24. The first through-hole 252 may be, for example, formed on the central axis of the nozzle 24, and the first through-holes 252 may further be formed annularly outside the first through-hole 252. That is, the central axis of the nozzle 24 and a central axis of one through-hole 252 of each set of first through-holes 252 may coincide with each other. In this case as well, the nozzle 24 does not face the second through-holes 254.

The distance between the nozzle 24 and the rectifying plate 222 is set to a distance at which the gas flows not only to the first through-holes 252 but also to the second through-holes 254. In the present embodiment, the distance between the nozzle 24 and the rectifying plate 222 is set at, for example, 2.5 mm.

A gas flow when the rectifying plate 222 according to the present embodiment is attached to the chamber 12 in the same manner as the rectifying plate 22 described in the first embodiment and a film is formed on the substrate 8 in the chamber 12 will be described.

When a gas for film formation is injected from the nozzle 24 toward the rectifying plate 222, a part of the gas enters the chamber 12 through the first through-holes 252 of the high flow path resistance area 232 inside the spray pattern formed by the gas shown in FIG. 16 and FIG. 17. The remaining gas collides with a top surface of the rectifying plate 222 and spreads along the top surface of the rectifying plate 222. Since the second through-holes 254 of the low flow path resistance area 234 are formed outside the spray pattern of the gas injected from the nozzle 24, a part of the gas enters the chamber 12 through the second through-holes 254.

When the gas is introduced into the chamber 12 through the rectifying plate 222, a pressure distribution near a lower surface of the rectifying plate 222 in the chamber 12 changes. An opening diameter of the second through-holes 254 is larger than that of the first through-holes 252, and the second through-holes 254 are easier for the gas to pass through than the first through-holes 252. In addition, the number of the second through-holes 254 is larger than that of the first through-holes 252. Thus, the rectifying plate 222 can balance a flow rate of the gas directly entering the chamber 12 through the first through-holes 252 and a flow rate of the gas entering the chamber 12 through the second through-holes 254. Further, since the through-holes 252 and 254 are disposed with the constant pitches, it is possible to suppress bias in the pressure distribution near the lower surface of the rectifying plate 222 in the chamber 12.

For example, when the rectifying plate 22 described in the first embodiment is used, after the gas is injected to the closing portion (high flow path resistance area) 32, the gas passes through the through-holes 34 outside the closing portion (high flow path resistance area) 32 and the gas is introduced into the chamber 12. Since the gas is introduced into the chamber 12 through the through-holes 34, it is assumed that the pressure is high immediately below the through-holes 34 and the pressure drops in an area on the lower surface side of the rectifying plate 22 between adjacent through-holes 34. Therefore, the gas may flow to the lower surface side of the area where the pressure is low other than immediately below the through-holes 34, and the gas may be agitated or flowed back in the chamber 12, making it difficult to control the gas flow in the chamber 12.

The rectifying plate 222 according to the present embodiment can suppress variations in the growth rate on the substrate 8 due to an error in attaching the rectifying plate 222 to the chamber 12 as described in the first embodiment. Further, in the rectifying plate 222 according to the present embodiment, the bias in the pressure distribution near the lower surface of the rectifying plate 222 in the chamber 12 can be suppressed by the first through-holes 252. Therefore, by attaching the rectifying plate 222 according to the present embodiment to the chamber 12 and using it, the agitation and backflow of the gas in the chamber 12 can be suppressed, and the gas flow in the chamber 12 can be easily controlled. Then, for example, by controlling the gas flow in the chamber 12 for each of the zones Z1, Z2, and Z3, the growth rate can be controlled according to the distance from the center of the substrate 8.

The first through-holes 252 and the second through-holes 254 can be set to appropriate sizes such as appropriate diameters by maintaining the large-small relationship. Then, although depending on a flow rate per unit time of the purge gas put into the chamber 12 through the purge gas flow paths 246, a flow rate of the gas injected from the nozzles 24 per unit time, etc., by appropriately increasing the sizes of the first through-holes 252 and the second through-holes 254, the flow of the gas line contributing to the film formation can be strengthened and the influence of the flow of the purge gas supplied into the chamber 12 through the rectifying plate 222 can be suppressed.

Figure 18:
FIG. 18 is a schematic perspective view illustrating a growth rate distribution at a discretionary time on a rotated substrate of the film-forming apparatus according to the second embodiment when the rectifying plate is disposed with a displacement of X+1.5 mm relative to a reference position of a chamber.
Figure 18:
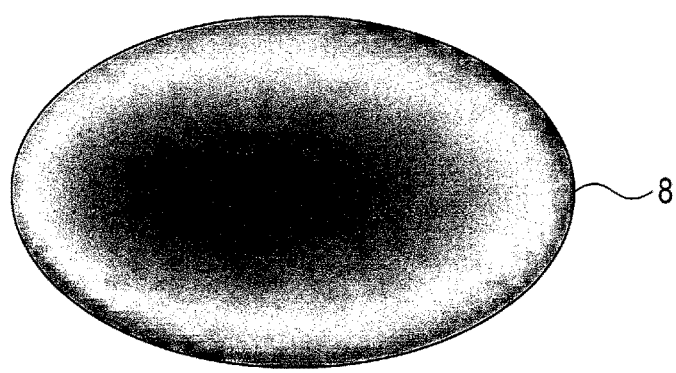
Figure 19:
FIG. 19 is a schematic perspective view illustrating a growth rate distribution at a discretionary time on the rotated substrate of the film-forming apparatus according to the second embodiment when the rectifying plate is disposed with a displacement of X−1.5 mm relative to the reference position of the chamber.
Figure 19:
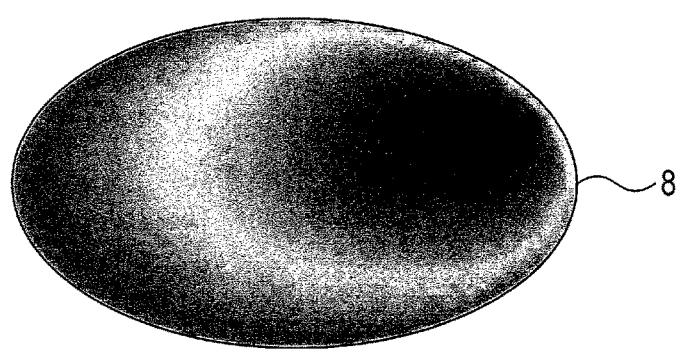

FIG. 18 illustrates a simulation result of a growth rate distribution at a discretionary time on the rotated substrate 8 of the film-forming apparatus 10 when the rectifying plate 222 is attached, with a displacement of 1.5 mm in the +X axis direction relative to the reference position of the chamber 12. FIG. 18 is illustrated as a perspective view of the substrate 8. FIG. 19 illustrates a simulation result of a growth rate distribution at discretionary time on the rotated substrate 8 of the film-forming apparatus 10 when the rectifying plate 222 is attached, with a displacement of 1.5 mm in the −X direction relative to the reference position of the chamber 12. FIG. 19 is illustrated as a perspective view of the substrate 8. Note that 1.5 mm mentioned here is larger than 0.3 mm, which is the tolerable error relative to the reference position at the time when the rectifying plate 222 is attached to the chamber 12. The growth rate distributions in FIG. 18 and FIG. 19 are illustrated as relative growth rates when the minimum growth rate in FIG. 18 is set at 1.0. In the example illustrated in FIG. 18, the growth rate increases near the center of the substrate 8. In the example illustrated in FIG. 19, the growth rate increases at a position deviated from the center of the substrate 8.

The growth rates in the substrates 8 in the example illustrated in FIG. 18 and the example illustrated in FIG. 19 were simulated as illustrated in FIG. 20. FIG. 20 is a graph illustrating a relationship between a distance from the central axis of the substrate 8 and a time-averaged growth rate in the film-forming apparatus 10 according to the second embodiment when the rectifying plate 222 is disposed with a displacement relative to the reference position of the chamber 12. A black circle plot illustrated in FIG. 20 is an example when the rectifying plate 222 is attached to the one end of the chamber 12, with a displacement of +1.5 mm in the X axis direction relative to the reference position. A white circle plot illustrated in FIG. 20 is an example when the rectifying plate 222 is attached to the one end of the chamber 12, with a displacement of −1.5 mm in the X axis direction relative to the reference position. When comparing the black circle plot and the white circle plot in FIG. 20, it is understood that there is no large variation between both cases. This tendency is substantially the same as the tendency illustrated in FIG. 8 of the first embodiment. At this time, a variation rate of the growth rate at the central part of the substrate 8 was suppressed to approximately 7%. As the attaching position of the rectifying plate 222 with respect to the chamber 12 approaches the reference position, the four first through-holes 252 are equidistant with respect to the central axis of the nozzle 24. Therefore, when the rectifying plate 222 is attached to the chamber 12 and used, it is assumed that the variation rate of the growth rate at the central part of the substrate 8 can further be reduced.

Therefore, according to the present embodiment, it is possible to provide the rectifying plate 222 which can suppress a variation in the growth rate of film formation on a film-formation target before and after the replacement of the rectifying plate 222 by, for example, maintenance; the fluid-introducing apparatus 14 including the rectifying plate 222; and the film-forming apparatus 10 including the fluid-introducing apparatus 14.

In the present embodiment, a description has been given of the four first through-holes 252 as one set, but it suffices that one or more first through-holes 252 are provided in the high flow path resistance area 232. Regarding an opening area density of the high flow path resistance area 232, it suffices that an opening area density of the low flow path resistance area 234 is small so that the flow path resistance of the high flow path resistance area 232 is larger than that of the low flow path resistance area 234. For example, the first through-holes 252, which have a set of two, may be disposed with a predetermined pitch, the first through-holes 252, which have a set of three, may be disposed, for example, at positions of vertices of an equilateral triangle, and the first through-holes 252, which have a set of five, may be disposed, for example, at positions of vertices of an equilateral pentagon, in all of which cases the same effect can be obtained. The arrangement of the first through-holes 252 may be such that the bias in the pressure distribution near the lower surface of the rectifying plate 222 in the chamber 12 can be suppressed.

In the present embodiment, an example has been described in which the first through-holes 252 and the second through-holes 254 are circular through-holes. The first through-holes 252 and the second through-holes 254 may be polygonal, such as a triangle or a quadrangle. Further, the second through-holes 254 may be formed as an elongated hole in which a plurality of second through-holes 254 are connected, etc. The second through-holes 254 may be formed as one continuous hole surrounding a part or all of a periphery of a plurality of first through-holes 252.

(First Modification)

A first modification of the second embodiment will be described with reference to FIG. 21 and FIG. 22.

FIG. 21 illustrates a schematic top view of a rectifying plate 322 according to the present modification. In FIG. 21, illustrations of the nozzles 24 are omitted. In the rectifying plate 322 according to the present modification, the arrangement and number of the first through-holes 252 and the second through-holes 254 are different from those of the rectifying plate 222 described in the second embodiment. The pitch of the through-holes 252 and 254 is 10 mm in the rectifying plate 322 according to the present modification.

As illustrated in FIG. 21, the first through-holes 252 in the first zone Z1 have a set of two. In this case, the first through-holes 252 are located at one end and the other end of a line segment having a length corresponding to the constant pitch. The first through-holes 252 in the second zone Z2 have a set of three. In this case, the first through-holes 252 are located at vertices of an isosceles right triangle having two line segments each having a length corresponding to the constant pitch. The first though-holes 252 in the third zone Z3 have a set of four. In this case, the first through-holes 252 are located at vertices of a square formed by line segments each having a length corresponding to the constant pitch.

The nozzles 24 are disposed relative to the rectifying plate 322 in the same manner as in the positional relationship of those with respect to the first through-holes 252 of the rectifying plate 222 of the second embodiment. That is, in each of the zones Z1, Z2, and Z3, the nozzles 24 are opposed to the first through-holes 252 of the high flow path resistance area 232 including a nozzle-facing area which is opposed to the nozzle 24. When a gas for film formation is injected from the nozzle 24 toward the rectifying plate 322, a part of the gas is introduced into the chamber 12 through the first through-holes 252 inside the spray pattern formed by the gas. The remaining gas collides with a top surface of the rectifying plate 322 and spreads along the top surface of the rectifying plate 322. Since the second through-holes 254 are formed outside the spray pattern of the gas injected from the nozzle 24, a part of the gas is introduced into the chamber 12 through the second through-holes 254.

When the gas is introduced into the chamber 12 through the rectifying plate 322, a pressure distribution near a lower surface of the rectifying plate 322 in the chamber 12 changes. A large-small relationship between the diameter of the first through-hole 252 and that of the second through-hole 254 is the same as that of the rectifying plate 222 described in the second embodiment. Therefore, the rectifying plate 322 can balance a flow rate of the gas directly entering the chamber 12 through the first through-holes 252 and a flow rate of the gas entering the chamber 12 through the second through-holes 254. Further, since the through-holes 252 and 254 are disposed with the constant pitches, it is possible to suppress bias in the pressure distribution near the lower surface of the rectifying plate 322 in the chamber 12.

By attaching the rectifying plate 322 according to the present embodiment to the chamber 12 and using it, the agitation and backflow of the gas in the chamber 12 can be suppressed, and the gas flow in the chamber 12 can be easily controlled. Then, for example, since the gas flow in the chamber 12 can be controlled for each of the zones Z1, Z2, and Z3, the growth rate can be controlled according to the distance from the center of the substrate 8.

Therefore, according to the present modification, it is possible to provide the rectifying plate 322 which can suppress a variation in the growth rate of film formation on a film-formation target before and after the replacement of the rectifying plate 322 by, for example, maintenance; the fluid-introducing apparatus 14 including the rectifying plate 322; and the film-forming apparatus 10 including the fluid-introducing apparatus 14.

Figures 22, 23:
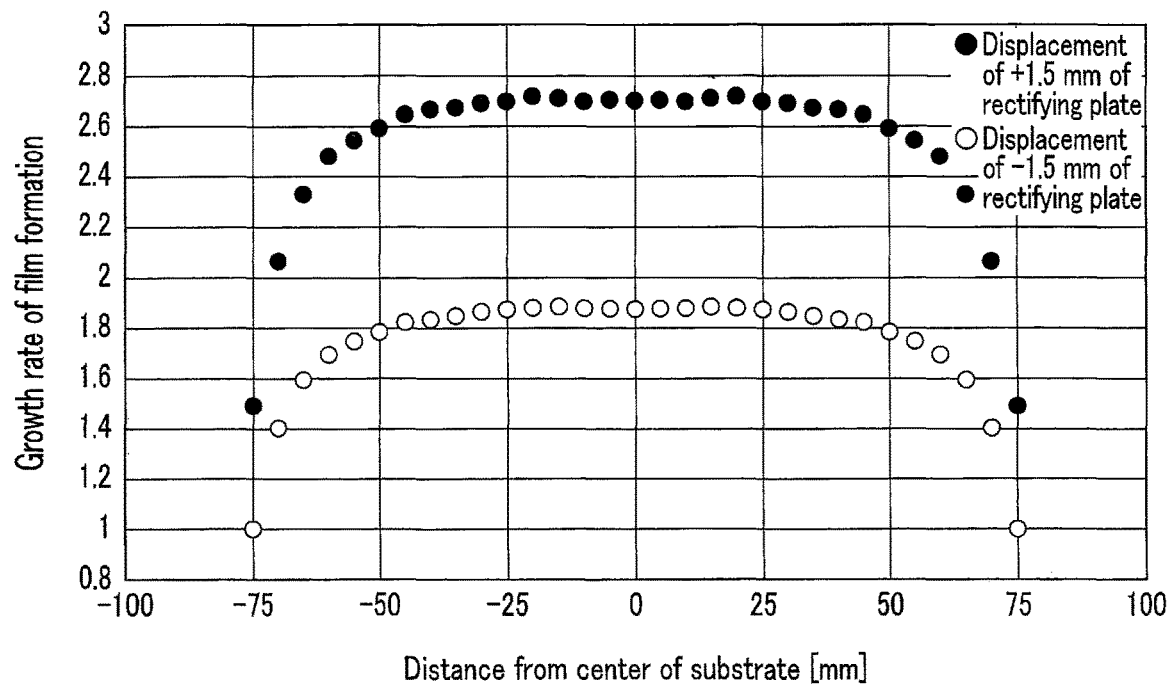
FIG. 22 is a graph illustrating a relationship between a distance from a central axis of a substrate and a growth rate in a film-forming apparatus according to the first modification of the second embodiment when the rectifying plate is disposed with a displacement relative to a reference position of a chamber.
FIG. 23 is a formula for determining a difference in growth rate from a center of the substrate to an edge.

Herein, FIG. 22 illustrates a relationship between a growth rate distribution on the substrate 8 when the rectifying plate 322 according to the present modification is attached to the chamber 12 with a displacement of 1.5 mm in the +X axis direction from the central axis of the rectifying plate 322 toward the three central axes of the purge gas flow paths 246 and that when the rectifying plate 322 is attached to the chamber 12 with a displacement of 1.5 mm in the −X axis direction opposite to the side of the three central axes of the purge gas flow paths 246 from the central axis of the rectifying plate 322. Note that 1.5 mm mentioned here is larger than 0.3 mm, which is the tolerable error relative to the reference position at the time when the rectifying plate 322 is attached to the chamber 12.

Then, as in a formula indicated in FIG. 23, a difference in growth rate at each point from the center (including the center) of the substrate 8 to the edge of the substrate 8 being divided by an average of the growth rate (X+1.5 mm) is added up for sixteen points from the center to the edge, and the sum is divided by 16 and multiplied by 100 to be expressed in (%). This is assumed to be a difference in growth rate from the center to the edge of the substrate 8.

A difference in growth rate from the center of the substrate 8 to the edge of the substrate 8 when the rectifying plate 222 according to the second embodiment is attached to the chamber 12 and used, when calculated using the data illustrated in FIG. 20, is 4.6%. A difference in growth rate from the center of the substrate 8 to the edge of the substrate 8 when the rectifying plate 322 according to the present modification is attached to the chamber 12 and used, when calculated using the data illustrated in FIG. 22, is 31.1%. Accordingly, it can be said that the number of first through-holes 252 is preferably the same in each of the zones Z1, Z2, and Z3. By making the number of the first through-holes 252 the same in each of the zones Z1, Z2, and Z3 as in the rectifying plate 222 according to the second embodiment, it is possible to reduce the difference in growth rate from the center to the edge of the substrate 8 as compared with the case of using the rectifying plate 322 described in the present modification.

(Second Modification)

A second modification of the second embodiment will be described with reference to FIGS. 24 to 28.

Figure 24:
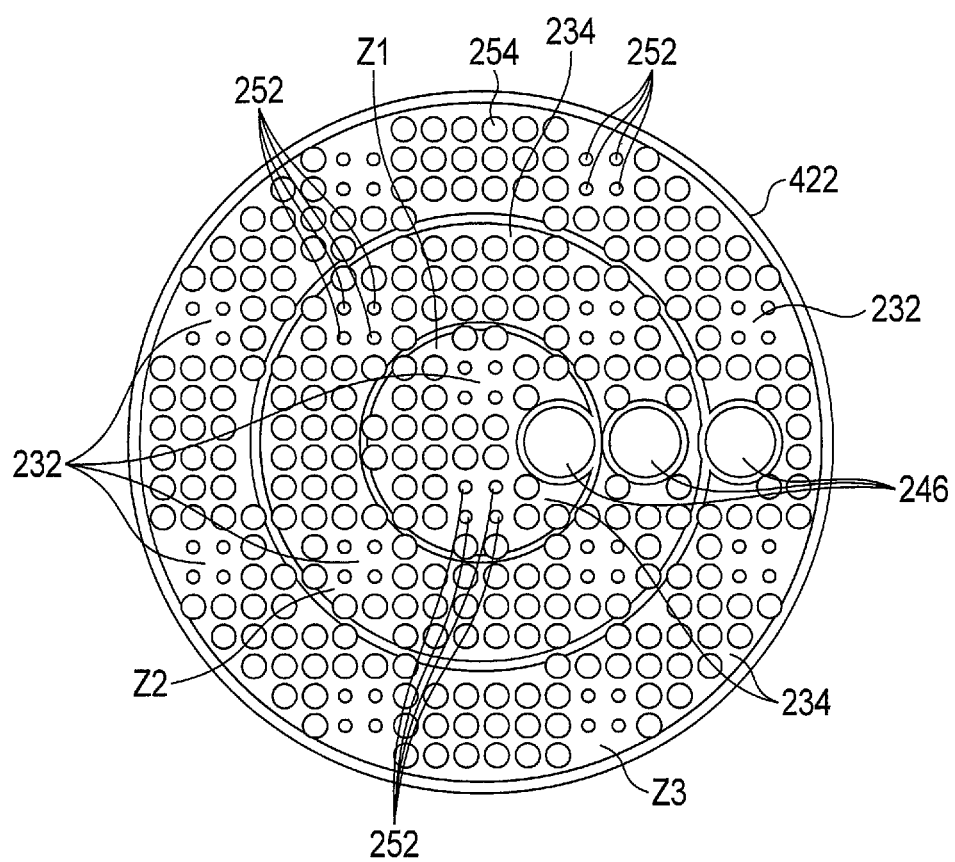
FIG. 24 is a schematic top view illustrating a rectifying plate according to a second modification of the second embodiment.

FIG. 24 illustrates a schematic top view of a rectifying plate 422 according to the present modification. Illustrations of the nozzles 24 are omitted in FIG. 24. In each of the zones Z1, Z2, and Z3, the nozzles 24 are opposed to the first through-holes 252 of the high flow path resistance area 232 including a nozzle-facing area which is opposed to the nozzle 24. A diameter of the first through-hole 252 of the rectifying plate 422 according to the present modification is 3 mm, which is smaller than 5 mm as the diameter of the first through-hole 252 of the rectifying plate 222 according to the second embodiment. A diameter of the second through-hole 254 of the rectifying plate 422 is 7 mm, which is the same as in the rectifying plate 222 according to the second embodiment. A constant pitch of the through-holes 252 and 254 of the rectifying plate 422 is 8 mm, which is the same as in the rectifying plate 222 according to the second embodiment.

A flow of a gas was analyzed at a position 100 mm immediately below the rectifying plate 422 in a state where the rectifying plate 422 according to the present modification is attached to an appropriate position of the chamber 12.

FIG. 25 illustrates a schematic cross-sectional view of the chamber 12 having a cylindrical shape at a position 100 mm immediately below the rectifying plate 422 in the chamber 12 between the rectifying plate 422 and the rotation stage 18. In addition, FIG. 25 illustrates a simulation result of capturing an upward (+Z direction) movement of the gas at the position 100 mm immediately below the rectifying plate 422 in the chamber 12. Thus, FIG. 25 is a contour diagram illustrating that no updraft of the gas is generated in the chamber 12 at the position 100 mm immediately below the rectifying plate 422 when a film is formed on the substrate 8 in a state where the rectifying plate 422 according to the present modification is attached to the reference position of the chamber 12. In FIG. 25, a downward movement of the gas is not shown. In addition, in FIG. 25, a speed distribution along with the upward movement of the gas is indicated as a relative speed when the minimum speed is set at 1.0. As illustrated in FIG. 25, it was not confirmed that the gas moved upward in areas of the whole area at the position 100 mm immediately below the rectifying plate 422 in the chamber 12. Although depending on a flow rate of the gas from the nozzles 24, a flow rate of the purge gas, etc., it can be confirmed that the gas does not move upward in an area below the rectifying plate 422 when the rectifying plate 422 according to the present modification is attached to the chamber 12 and used under a certain condition.

Here, a flow of a gas was analyzed at a position 100 mm immediately below the rectifying plate 222 in a state where the rectifying plate 222 according to the second embodiment is attached to an appropriate position of the chamber 12, for a comparison with the rectifying plate 422 according to the present modification.

FIG. 26 illustrates a schematic cross-sectional view of the chamber 12 having a cylindrical shape at a position 100 mm immediately below the rectifying plate 222 in the chamber 12 between the rectifying plate 222 and the rotation stage 18. FIG. 26 illustrates a simulation result of capturing an upward (+Z direction) movement of the gas at the position 100 mm immediately below the rectifying plate 222 in the chamber 12. Thus, FIG. 26 is a contour diagram illustrating updraft of the gas in the chamber 12 at the position 100 mm immediately below the rectifying plate 222 when a film is formed on the substrate 8 in a state where the rectifying plate 222 illustrated in FIG. 15 according to the second embodiment is attached to the reference position of the chamber 12.

FIG. 26 does not show a downward movement of the gas. In addition, in FIG. 26, a speed distribution along with the upward movement of the gas is illustrated as a relative speed when the minimum speed rate is set at 1.0. As illustrated in FIG. 26, it can be confirmed that the gas moves upward in an area of 21% of the whole area at the position 100 mm immediately below the rectifying plate 222 in the chamber 12. Although depending on a flow rate of the gas from the nozzles 24, a flow rate of the purge gas, etc., it can be confirmed that the gas moves upward in an area below the rectifying plate 222 in the chamber 12 when the rectifying plate 222 according to the second embodiment is attached to the chamber 12 and used under a certain condition.

Figure 27:
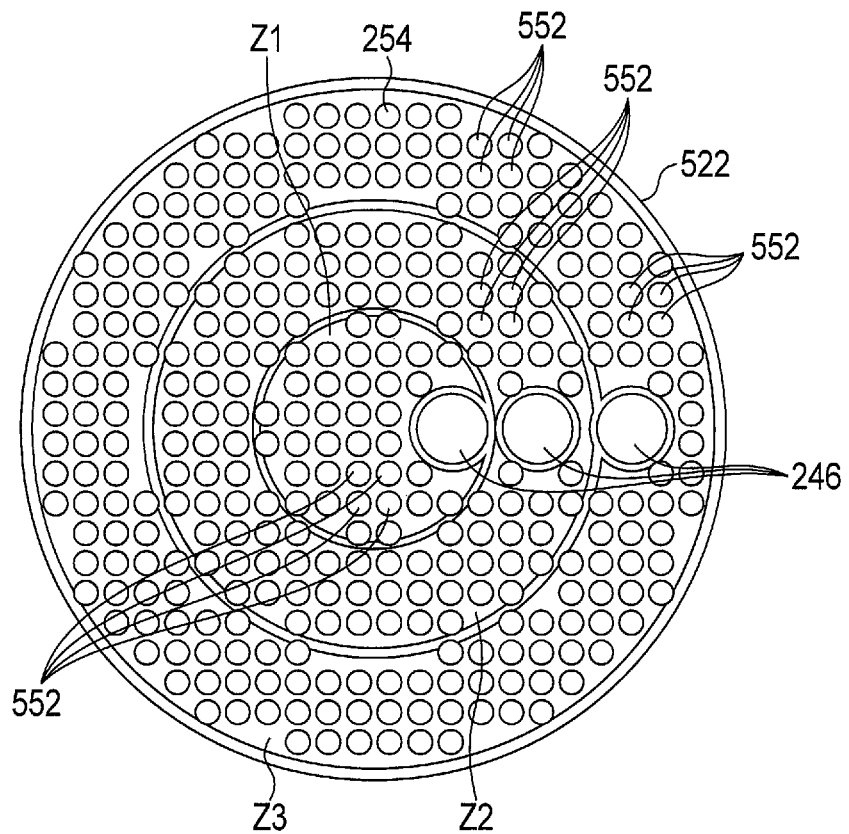
FIG. 27 is a schematic top view illustrating a rectifying plate according to a comparative example.

In addition, for comparison with the rectifying plate 422 according to the present modification and the rectifying plate 222 according to the second embodiment, a rectifying plate 522 illustrated in FIG. 27 is used as a comparative example. FIG. 27 illustrates a schematic top view of the rectifying plate 522 according to the comparative example. Illustrations of the nozzles 24 are omitted in FIG. 27. In each of the zones Z1, Z2, and Z3, the nozzles 24 are opposed to first through-holes 552 of the high flow path resistance area 232 including a nozzle-facing area which is opposed to the nozzle 24. It is assumed that the first through-holes 552 of the rectifying plate 522 are disposed in the same manner as the first through-holes 252 of the rectifying plate 422 illustrated in FIG. 24. It is also assumed that the second through-holes 254 of the rectifying plate 522 are disposed in the same manner as the second through-holes 254 of the rectifying plate 422 illustrated in FIG. 24. A diameter of the first through-hole 552 and a diameter of the second through-hole 254 of the rectifying plate 522 according to the comparative example are 7 mm, which are the same. A constant pitch of the through-holes 552 and 254 of the rectifying plate 522 is 8 mm, which is the same as in the rectifying plate 222 according to the second embodiment.

A flow of a gas was analyzed at a position 100 mm immediately below the rectifying plate 522 in a state where the rectifying plate 522 according to the comparative example is attached to an appropriate position of the chamber 12.

Figure 28:
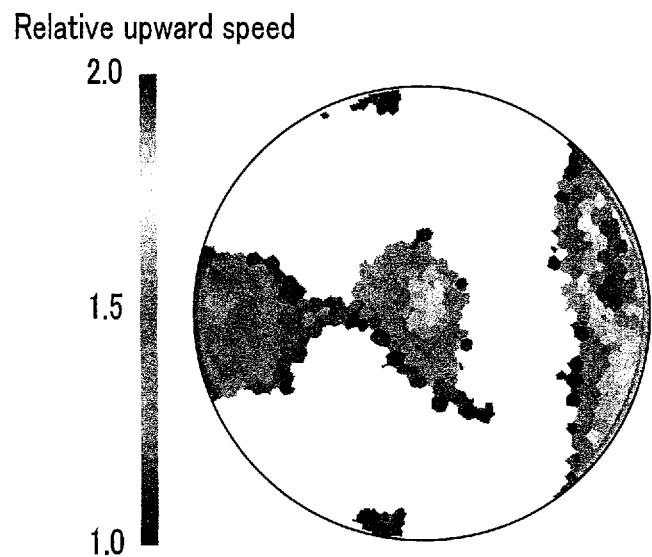
FIG. 28 is a contour diagram illustrating updraft of a gas immediately below the rectifying plate in a chamber when forming a film on a substrate in a state where the rectifying plate illustrated in FIG. 27 is attached to a reference position of the chamber.

FIG. 28 illustrates a simulation result of capturing an upward (+Z direction) movement of the gas at the position 100 mm immediately below the rectifying plate 522 in the chamber 12. Thus, FIG. 28 is a contour diagram illustrating updraft of the gas in the chamber 12 at the position 100 mm immediately below the rectifying plate 522 when a film is formed on the substrate 8 in a state where the rectifying plate 522 illustrated in FIG. 27 according to the comparative example is attached to the reference position of the chamber 12.

FIG. 28 does not show a downward movement of the gas. In addition, in FIG. 28, a speed distribution along with the upward movement of the gas is illustrated as a relative speed when the minimum speed is set at 1.0. As illustrated in FIG. 28, it can be confirmed that the gas moves upward in an area of 31% of the whole area at the position 100 mm immediately below the rectifying plate 522 in the chamber 12. Although depending on a flow rate of the gas from the nozzles 24, a flow rate of the purge gas, etc., it can be confirmed that the gas moves upward in an area below the rectifying plate 522 when the rectifying plate 522 according to the comparative example is attached to the chamber 12 and used under a certain condition.

Accordingly, it can be said that the larger (larger in opening area) the diameter of the first through-hole 252 than that of the second through-hole 254, the easier the gas moves upward in the area below the rectifying plate, and the gas is unintentionally agitated, etc. in the chamber 12. Thus, the diameter of the first through-hole 252 of the rectifying plate 422 according to the present modification is preferably smaller than 5 mm. The diameter of the first through-hole 252 is preferably, for example, within 0.7 times that of the second through-hole 254.

On the other hand, by reducing the diameter of the first through-hole 252, it is conceivable that a sufficient effect cannot be obtained from the viewpoint of suppression of gas agitation and backflow and gas flow control. Accordingly, in the first through-holes 252 of the rectifying plate 422 according to the modification, a diameter for rectifying the gas flow in the chamber 12 is set as a minimum diameter (minimum opening area) so as to prevent backflow of the gas at a predetermined position in the chamber 12. At this time, although depending on a gas injected from the nozzles 24, a flow rate of a purge gas, etc., the minimum diameter of the first through-hole 252 is set so as to prevent the backflow of the gas. Alternatively, the minimum diameter (minimum opening area) may be set so as to suppress a change in gas flow due to the first through-holes 252 being closed and the flow path resistance fluctuating over time.

Accordingly, by appropriately setting the diameter of the first through-hole 252 with respect to the second through-hole 254 of the rectifying plate 422 according to the present modification, it is possible to suppress agitation and backflow of the gas in the chamber 12 and control the growth rate according to the distance from the center of the substrate 8 when the rectifying plate 422 is attached to the chamber 12.

In this way, the relationship between the second through-holes 254 and the first through-holes 252 is preferably to have hole diameters that do not cause backflow toward the lower surface of the rectifying plate 422 by the gas flowing downward through the first through-holes 252. For example, although depending on various conditions such as a flow rate from the nozzles 24 per unit time, with a gap between the rectifying plate 422 and the nozzles 24 of 2.5 mm, the first through-holes 252 and the second through-holes 254 of the rectifying plate 422 being disposed with a constant pitch of 8 mm, the diameter of the second through-hole 254 of 7 mm, and the diameter of the first through-hole 252 of 3 mm, which is smaller than 0.7 times the diameter of the second through-hole 254, when a gas is injected from the nozzles 24 and a hydrogen gas is injected from the purge gas nozzles, generation of gas backflow is suppressed in the chamber 12.

Even if the position of the rectifying plate 422 is displaced relative to the chamber 12, it is possible to suppress a deviation of the growth rate distribution.

According to the present modification, it is possible to provide the rectifying plate 422 which can suppress a variation in the growth rate of film formation on a film-formation target before and after the replacement of the rectifying plate 422 by, for example, maintenance; the fluid-introducing apparatus 14 including the rectifying plate 422; and the film-forming apparatus 10 including the fluid-introducing apparatus 14.

According to at least one of the embodiments described above, it is possible to provide a rectifying plate which can suppress a variation in growth rate of film formation on a film-formation target before and after replacement of the rectifying plate by, for example, maintenance; a fluid-introducing apparatus including the rectifying plate; and a film-forming apparatus including the fluid-introducing apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A rectifying plate configured to rectify a fluid that is injected from a plurality of nozzles, the rectifying plate comprising:
   a plurality of first through-holes to allow the fluid to pass through, each of the plurality of first through-holes having an opening area that is smaller than an opening area of each of the plurality of nozzles;
   a plurality of high flow path resistance areas arranged apart from each other, each of the plurality of high flow path resistance areas including a nozzle-facing area disposed in an island arrangement to be opposed to one of the plurality of nozzles; and
   a low flow path resistance area including the plurality of first through-holes and disposed between at least one of the plurality of high flow path resistance areas and another of the plurality of high flow path resistance areas to separate the plurality of high flow path resistance areas from each other, wherein the plurality of first through-holes are disposed such that an opening area density of the low flow path resistance area is larger than an opening area density of each of the high flow path resistance areas.

2. The rectifying plate of claim 1, wherein the plurality of high flow path resistance areas are closed.

3. The rectifying plate of claim 1, wherein each of the plurality of high flow path resistance areas includes one or more second through-holes each having a smaller opening area than that of each of the plurality of first through-holes.

4. The rectifying plate of claim 3, wherein a number of the plurality of second through-holes in each of the plurality of high flow path resistance areas is the same.

5. The rectifying plate of claim 1, wherein the plurality of first through-holes are formed in the rectifying plate with a predetermined pitch.

6. The rectifying plate of claim 1, wherein:
   the rectifying plate is discoidal, and
   the plurality of first through-holes are formed at point-symmetric positions with respect to a center of the rectifying plate, or at line-symmetric positions with respect to a predetermined axis passing through the center of the rectifying plate.

7. A fluid-introducing apparatus comprising:
   the rectifying plate of claim 1; and
   the plurality of nozzles respectively disposed to be opposed to the plurality of nozzle-facing areas of the rectifying plate.

8. A film-forming apparatus comprising:
   the fluid-introducing apparatus of claim 7; and
   a chamber into which the fluid is introduced by the fluid-introducing apparatus.

* * * * *